US012757770B2

(12) United States Patent
Koike

(10) Patent No.: US 12,757,770 B2
(45) Date of Patent: Oct. 6, 2026

(54) ISOLATOR

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Daisuke Koike, Tama (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 338 days.

(21) Appl. No.: 18/637,328

(22) Filed: Apr. 16, 2024

(65) Prior Publication Data

US 2025/0105125 A1 Mar. 27, 2025

(30) Foreign Application Priority Data

Sep. 21, 2023 (JP) ................................ 2023-155685

(51) Int. Cl.
*H10W 70/65* (2026.01)
*H10W 74/10* (2026.01)
*H10W 90/00* (2026.01)

(52) U.S. Cl.
CPC ........... *H10W 70/65* (2026.01); *H10W 90/00* (2026.01); *H10W 90/701* (2026.01); *H10W 74/10* (2026.01); *H10W 90/754* (2026.01); *H10W 90/755* (2026.01)

(58) Field of Classification Search
CPC ................. H10W 70/65; H10W 90/00; H10W 90/701; H10W 90/754; H10W 90/755; H10W 74/10; H10W 44/501
See application file for complete search history.

(56) References Cited

U.S. PATENT DOCUMENTS

| | | | | |
|---|---|---|---|---|
| 9,560,757 | B2 | 1/2017 | Murayama et al. | |
| 2018/0366409 | A1* | 12/2018 | Kuwabara ........... | H10W 20/497 |
| 2020/0082977 | A1* | 3/2020 | Ishihara .................. | H01F 27/38 |

FOREIGN PATENT DOCUMENTS

| | | |
|---|---|---|
| JP | H 0923099 | 1/1997 |
| JP | 2000 243862 | 9/2000 |
| JP | 2005 072482 | 3/2005 |
| JP | 4066050 | 3/2008 |
| JP | 5621951 | 11/2014 |

* cited by examiner

*Primary Examiner* — Khiem D Nguyen
(74) *Attorney, Agent, or Firm* — Knobbe, Martens, Olson & Bear, LLP

(57) ABSTRACT

An isolator according to one embodiment, includes a substrate and a plurality of leads. The substrate includes a lower surface, a plurality of coils, and a plurality of conductive parts. The lower surface has a quadrilateral shape. The plurality of coils includes a first coil, and a second coil. The plurality of conductive parts includes a first conductive part, a second conductive part, a third conductive part, and a fourth conductive part. The first conductive part includes a first terminal. The second conductive part includes a second terminal. The third conductive part includes a third terminal. The fourth conductive part includes a fourth terminal. The plurality of leads includes a first lead, a second lead, a third lead, and a fourth lead. The plurality of leads includes a metal.

15 Claims, 13 Drawing Sheets

ISOLATOR

CROSS-REFERENCE TO RELATED APPLICATIONS

This application is based upon and claims the benefit of priority from Japanese Patent Application No. 2023-155685, filed on Sep. 21, 2023; the entire contents of which are incorporated herein by reference.

FIELD

Embodiments relate to an isolator.

BACKGROUND

A known isolator transmits a signal from a transmitting-side circuit to a receiving-side circuit in a state in which the transmitting-side circuit and the receiving-side circuit are insulated from each other.

DETAILED DESCRIPTION

Figure 1:
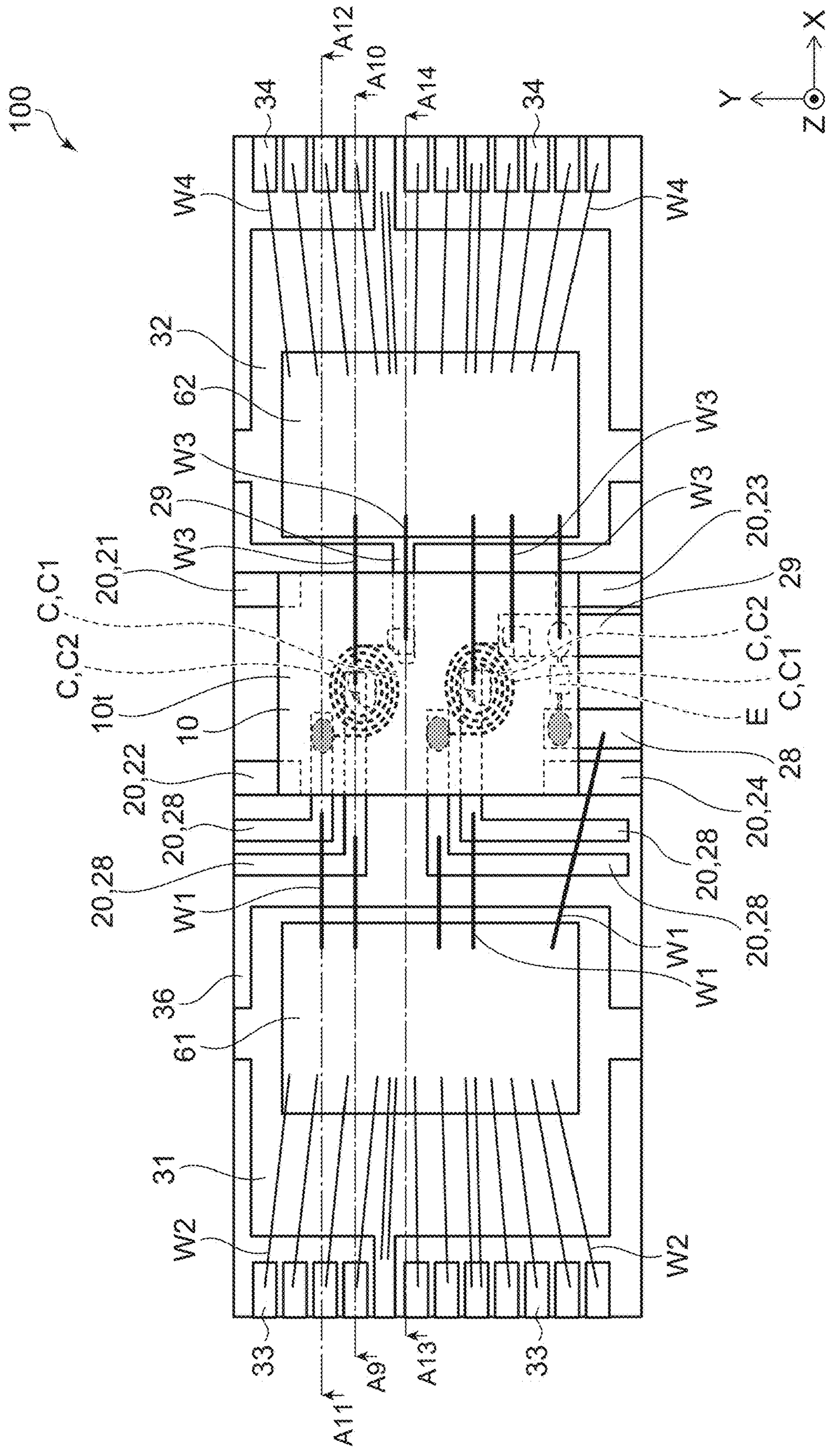
FIG. 1 is a schematic plan view illustrating an isolator according to an embodiment.

An isolator according to one embodiment, includes a substrate and a plurality of leads. The substrate includes an upper surface, a lower surface, a plurality of coils, and a plurality of conductive parts. The upper surface extends along a plane perpendicular to a first direction. The lower surface is at a side opposite to the upper surface. The lower surface has a quadrilateral shape including a first corner, a second corner, a third corner, and a fourth corner when viewed in plan along the first direction. The plurality of coils is located inside the substrate. The plurality of coils includes a first coil, and a second coil facing the first coil. The plurality of conductive parts includes a first conductive part, a second conductive part, a third conductive part, and a fourth conductive part. The first conductive part includes a first terminal. The first terminal is positioned at a first opening. The first opening is located at the first corner. The second conductive part includes a second terminal. The second terminal is positioned in a second opening. The second opening is located at the second corner. The third conductive part includes a third terminal. The third terminal is positioned at a third opening. The third opening is located at the third corner. The fourth conductive part includes a fourth terminal. The fourth terminal is positioned at a fourth opening. The fourth opening is located at the fourth corner. The plurality of leads includes a first lead, a second lead, a third lead, and a fourth lead. The first lead is connected with the first terminal by solder. The second lead is connected with the second terminal by solder. The third lead is connected with the third terminal by solder. The fourth lead is connected with the fourth terminal by solder. The plurality of leads includes a metal.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

FIG. 1 is a schematic plan view illustrating an isolator according to an embodiment.

The isolator 100 according to the embodiment includes a substrate 10, multiple leads 20, a first semiconductor chip 61, a second semiconductor chip 62, a die pad 31, a die pad 32, multiple external terminals 33, and multiple external terminals 34. These members are covered with an insulating part 36 (a sealing resin) (see FIG. 4A). FIG. 1 schematically illustrates the interior of the insulating part 36. The isolator 100 is, for example, a semiconductor package.

Figure 4A:
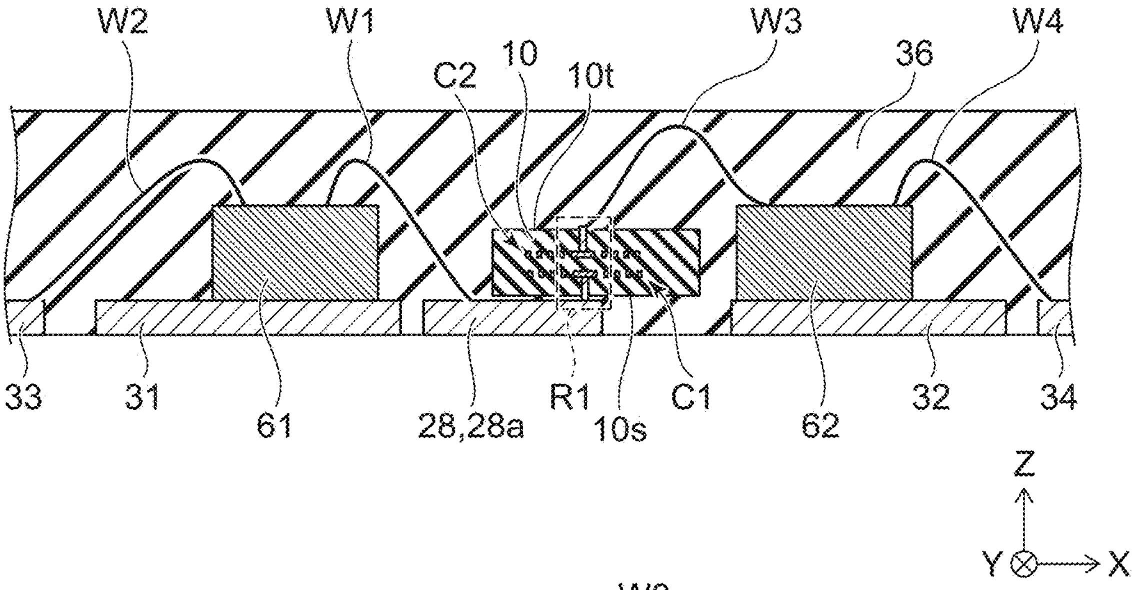
FIGS. 4A and 4B are schematic cross-sectional views illustrating the isolator according to the embodiment.

The substrate 10 includes an upper surface 10*t*, and a lower surface 10*s* at the side opposite to the upper surface 10*t* (see FIG. 4A). An XYZ orthogonal coordinate system is used in the description of embodiments. The direction perpendicular to the upper surface 10*t* is taken as a Z-direction (a first direction). Two mutually-orthogonal directions perpendicular to the Z-direction are taken as an X-direction (a second direction) and a Y-direction (a third direction). The upper surface 10*t* and the lower surface 10*s* each extend along the X-Y plane. In the description, the direction from the lower surface 10*s* toward the upper surface 10*t* is called "up/above/higher than", and the opposite direction is called "down/below/lower than". These directions are based on the relative positional relationship between the upper surface 10*t* and the lower surface 10*s*, and are independent of the direction of gravity.

Multiple coils C that include a first coil C1 and a second coil C2 are located inside the substrate 10. Each of the multiple coils C has a spiral shape when viewed in plan. The second coil C2 is arranged to face the first coil C1. The second coil C2 overlaps the first coil C1 in the vertical direction. The second coil C2 is located above the first coil C1, and is separated from the first coil C1. The first coil C1 and the second coil C2 are arranged to be magnetically coupled. Two first coils C1 and two second coils C2 are included in the example.

The multiple leads 20 are connected at the lower side of the substrate 10. The multiple leads 20 include a signal lead 28 that is electrically connected with the first semiconductor chip 61. The signal lead 28 is electrically connected with the first semiconductor chip 61 by a wire W1. The first coil C1 is electrically connected with the first semiconductor chip 61 via the signal lead 28 and the wire W1.

The first semiconductor chip 61 is fixed on the die pad 31 by, for example, an insulating bonding material. The first semiconductor chip 61 is electrically connected with an external terminal 33 by a wire W2. The external terminal 33 is positioned at the outer edge of the isolator 100 (the outer edge of the insulating part 36). An electrical signal from the outside is input to the first semiconductor chip 61 via the external terminal 33 and the wire W2.

The second semiconductor chip 62 is electrically connected with the second coil C2 via a wire W3. The second semiconductor chip 62 is fixed on the die pad 32 by, for example, an insulating bonding material. The second semiconductor chip 62 is electrically connected with an external terminal 34 by a wire W4. The external terminal 34 is positioned at the outer edge of the isolator 100 (the outer edge of the insulating part 36). An electrical signal from the second semiconductor chip 62 is output to the outside via the wire W4 and the external terminal 34.

The substrate 10 may include an element E other than the multiple coils C. The element E may be any circuit element, and may include, for example, at least one of a resistance, a capacitor, or an inductor. Similarly to the first coil C1, one end of the element E is electrically connected with the first semiconductor chip 61. Similarly to the second coil C2, another end of the element E is electrically connected with the second semiconductor chip 62.

Figure 2:
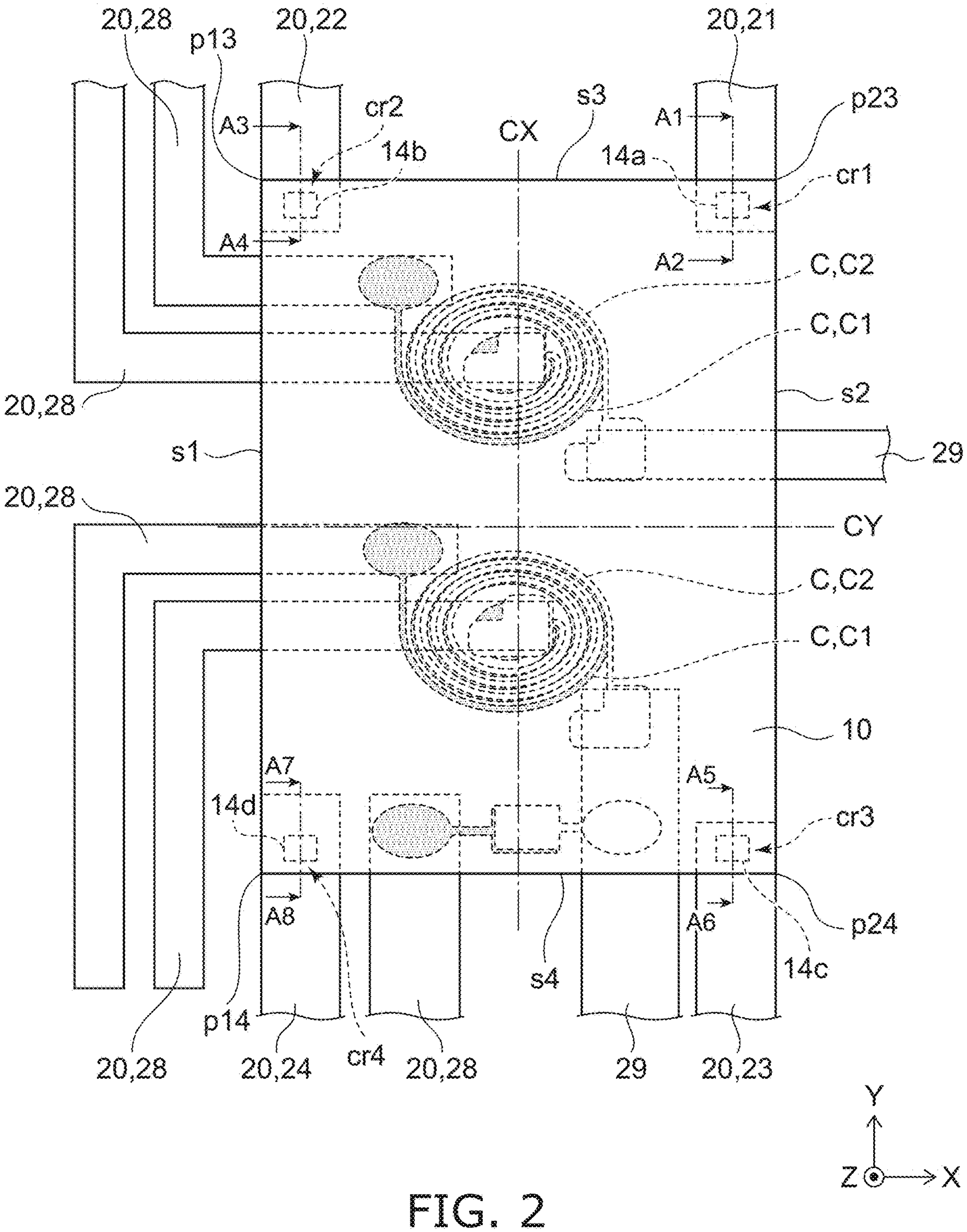
FIG. 2 is a schematic plan view illustrating the isolator according to the embodiment.

FIG. 2 is a schematic plan view illustrating the isolator according to the embodiment.

FIG. 2 is an enlarged illustration of a portion of the periphery of the substrate 10 illustrated in FIG. 1. The substrate 10 (the upper surface 10*t* and the lower surface 10*s*) has a quadrilateral shape (e.g., a rectangle) when viewed in plan along the Z-direction. In other words, the outer edge of the substrate 10 includes a first side s1, a second side s2, a third side s3, and a fourth side s4 when viewed in plan.

The second side s2 is separated from the first side s1 in the X-direction. The first side s1 and the second side s2 extend in the Y-direction. The third side s3 connects one end of the first side s1 and one end of the second side s2. The fourth side s4 is separated from the third side s3 in the Y-direction, and connects the other end of the first side s1 and the other end of the second side s2. The third side s3 and the fourth side s4 extend in the X-direction.

The lower surface 10*s* of the substrate 10 includes a first corner portion cr1, a second corner portion cr2, a third corner portion cr3, and a fourth corner portion cr4.

The first corner portion cr1 includes an intersection p23 (a vertex) between the second side s2 and the third side s3. For example, the first corner portion cr1 is more proximate to the intersection p23 than the multiple coils C. In other words, the distance from the intersection p23 to any point on the first corner portion cr1 is less than the shortest distance from the intersection p23 to any of the coils C. As an example, the first corner portion cr1 is within a range of 1 mm (millimeters) from the second side s2 and 1 mm from the third side s3.

Similarly, the second corner portion cr2 includes an intersection p13 (a vertex) between the first side s1 and the third side s3. For example, the second corner portion cr2 is more proximate to the intersection p13 than the multiple coils C. As an example, the second corner portion cr2 is within a range of 1 mm from the first side s1 and 1 mm from the third side s3.

The third corner portion cr3 includes an intersection p24 (a vertex) between the second side s2 and the fourth side s4. For example, the third corner portion cr3 is more proximate to the intersection p24 than the multiple coils C. As an example, the third corner portion cr3 is within a range of 1 mm from the second side s2 and 1 mm from the fourth side s4.

The fourth corner portion cr4 includes an intersection p14 (a vertex) between the first side s1 and the fourth side s4. For example, the fourth corner portion cr4 is more proximate to the intersection p14 than the multiple coils C. As an example, the fourth corner portion cr4 is within a range of 1 mm from the first side s1 and 1 mm from the fourth side s4.

The multiple leads 20 further include a first lead 21, a second lead 22, a third lead 23, and a fourth lead 24. For example, the four leads 20 (21 to 24) are located respectively at the four corners of the substrate 10 when viewed in plan.

FIGS. 3A to 3D are cross-sectional views illustrating portions of the isolator according to the embodiment.

Figure 3A:
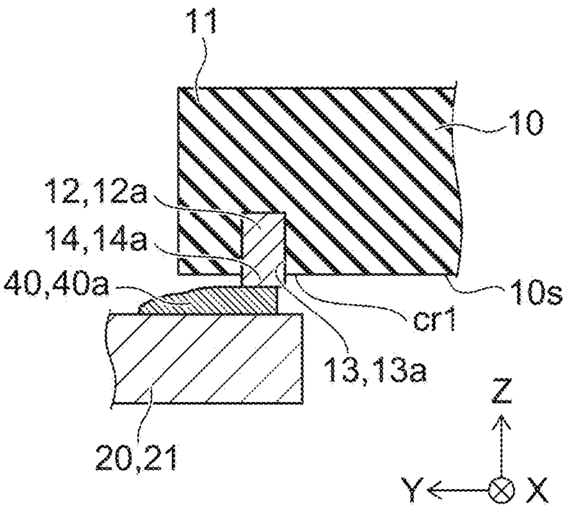
FIGS. 3A to 3D are cross-sectional views illustrating portions of the isolator according to the embodiment.
Figure 3B:
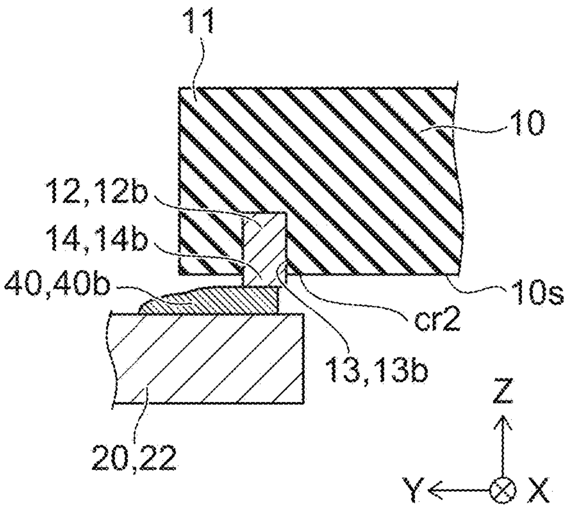
Figure 3C:
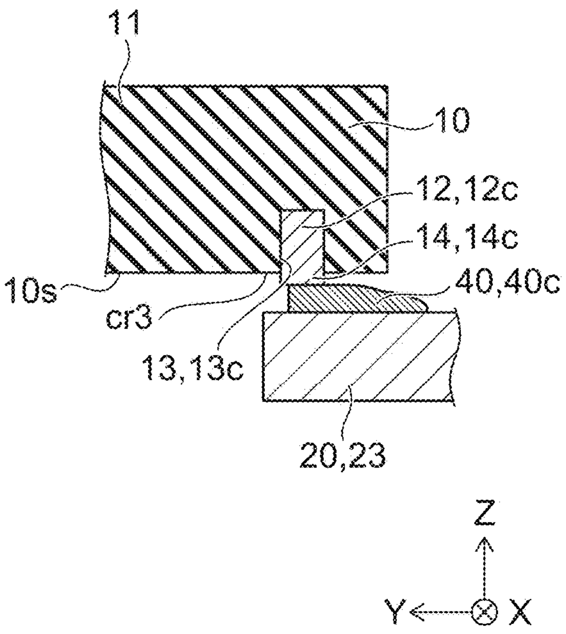
Figure 3D:
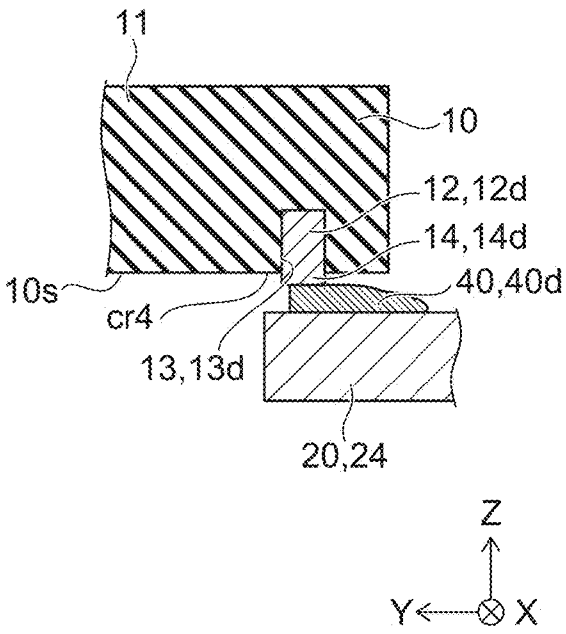

FIG. 3A corresponds to a line A1-A2 cross section shown in FIG. 2. FIG. 3B corresponds to a line A3-A4 cross section shown in FIG. 2. FIG. 3C corresponds to a line A5-A6 cross section shown in FIG. 2. FIG. 3D corresponds to a line A7-A8 cross section shown in FIG. 2.

The substrate 10 includes an insulating layer 11. As illustrated in FIGS. 3A to 3D, the substrate 10 includes multiple conductive parts 12. At least a portion of each conductive part 12 is located inside the substrate 10 (inside the insulating layer 11). The multiple coils C described above also are located inside the insulating layer 11.

Openings 13 are provided in the lower surface 10*s* of the substrate 10. The openings 13 are provided in the insulating layer 11. The conductive parts 12 include terminal portions 14 positioned at the openings 13. The terminal portions 14 are not covered with the substrate 10 at the openings 13. The terminal portions 14 may protrude lower than the lower surface 10*s*.

Specifically, as illustrated in FIG. 3A, an opening 13*a* is provided in the lower surface 10*s*. The multiple conductive parts 12 include a first conductive part 12*a*. The first conductive part 12*a* includes a first terminal portion 14*a* positioned at the opening 13*a*.

As illustrated in FIG. 3B, an opening 13*b* is provided in the lower surface 10*s*. The multiple conductive parts 12 include a second conductive part 12*b*. The second conductive part 12*b* includes a second terminal portion 14*b* positioned at the opening 13*b*.

As illustrated in FIG. 3C, an opening 13*c* is provided in the lower surface 10*s*. The multiple conductive parts 12 include a third conductive part 12*c*. The third conductive part 12*c* includes a third terminal portion 14*c* positioned at the opening 13*c*.

As illustrated in FIG. 3D, an opening 13*d* is provided in the lower surface 10*s*. The multiple conductive parts 12 include a fourth conductive part 12*d*. The fourth conductive part 12*d* includes a fourth terminal portion 14*d* positioned at the opening 13*d*.

For example, as illustrated in FIG. 2 above, the second terminal portion 14*b* and the fourth terminal portion 14*d* are at the side opposite to the first terminal portion 14*a* and the third terminal portion 14*c* when viewed from a center CX of the substrate 10 in the X-direction when viewed in plan. The third terminal portion 14*c* and the fourth terminal portion 14*d* are at the side opposite to the first terminal portion 14*a* and the second terminal portion 14*b* when viewed from a center CY of the substrate 10 in the Y-direction when viewed in plan.

More specifically, the first terminal portion 14*a* is positioned at the first corner portion cr1. The second terminal portion 14*b* is positioned at the second corner portion cr2. The third terminal portion 14*c* is positioned at the third corner portion cr3. The fourth terminal portion 14*d* is positioned at the fourth corner portion cr4.

In the example as illustrated in FIG. 2, when viewed in plan, the first lead 21 extends from the first terminal portion 14*a* and the third side s3 in the +Y direction (the direction from the fourth side s4 toward the third side s3); the second lead 22 extends from the second terminal portion 14*b* and the third side s3 in the +Y direction; the third lead 23 extends from the third terminal portion 14*c* and the fourth side s4 in the −Y direction (the opposite direction of the +Y direction); and the fourth lead 24 extends from the fourth terminal portion 14*d* and the fourth side s4 in the −Y direction.

In the examples illustrated in FIGS. 3A to 3D, the portions of the first to fourth conductive parts 12*a* to 12*d* other than the terminal portions 14 are covered with the insulating layer 11. For example, the entire surfaces of the portions of the first to fourth conductive parts 12*a* to 12*d* other than the terminal portions 14 contact the insulating layer 11. The first to fourth conductive parts 12*a* to 12*d* may be electrically insulated from other conductive parts and/or elements located inside the substrate 10. For example, the first to fourth conductive parts 12*a* to 12*d* may be electrically insulated from the multiple coils C. In other words, the first to fourth conductive parts 12*a* to 12*d* may be conductive parts 12 that are not used for conduction (do not carry electrical signals). The first to fourth conductive parts 12*a* to 12*d* may not contact components other than the insulating layer 11 inside the substrate 10.

The lead 20 is connected with the terminal portion 14 of the conductive part 12 by solder 40. That is, the upper surface of the solder 40 contacts the lower surface of the terminal portion 14. The lower surface of the solder 40 contacts the upper surface of the lead 20. The lead 20 and the conductive part 12 are electrically connected to each other via the solder 40.

For example, in FIGS. 3A to 3D, the first lead 21 is connected with the first terminal portion 14*a* by solder 40*a*; the second lead 22 is connected with the second terminal portion 14*b* by solder 40*b*; the third lead 23 is connected with the third terminal portion 14*c* by solder 40*c*; and the fourth lead 24 is connected with the fourth terminal portion 14*d* by solder 40*d*.

The first to fourth leads 21 to 24 may be electrically insulated from the first and second semiconductor chips 61 and 62. The first to fourth leads 21 to 24 may be electrically insulated from elements (the multiple coils C, etc.) located inside the substrate 10. In other words, the first to fourth leads 21 to 24 may be leads 20 that are not used for conduction (do not carry electrical signals). For example, the first to fourth leads 21 to 24 may not contact conductive members other than the solder 40. The potentials of the first to fourth leads 21 to 24 and the first to fourth conductive parts 12*a* to 12*d* may be electrically floating.

Figure 4B:
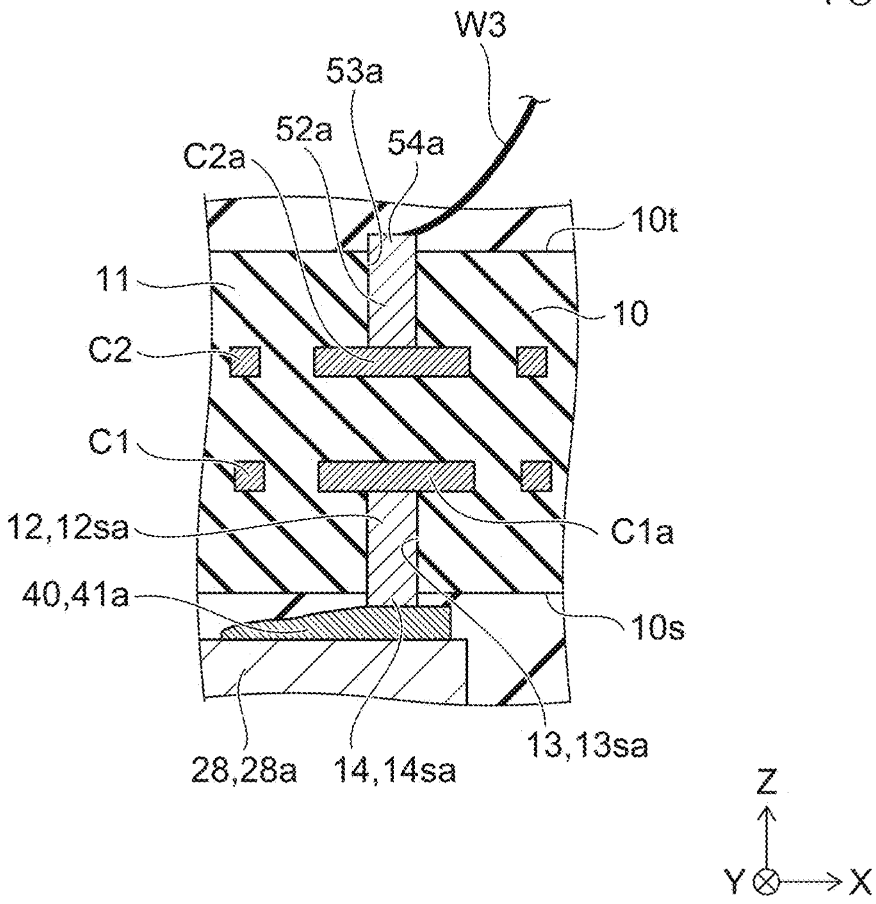

FIGS. 4A and 4B are schematic cross-sectional views illustrating the isolator according to the embodiment.

FIG. 4A corresponds to a line A9-A10 cross section shown in FIG. 1. FIG. 4B corresponds to an enlarged view of the vicinity of region R1 shown in FIG. 4A.

As illustrated in FIG. 4B, the multiple conductive parts 12 include a signal conductive part 12*sa*. The signal conductive part 12*sa* includes the terminal portion 14 (a signal terminal portion 14*sa*) positioned at the opening 13 (a signal opening 13*sa*) provided in the lower surface 10*s* of the substrate 10.

The signal conductive part 12*sa* is electrically connected with one end portion C1*a* of the first coil C1. The signal lead 28 (a signal lead 28*a*) is connected with the signal terminal portion 14*sa* by the solder 40 (solder 41*a*). As a result, the signal lead 28*a* is electrically connected with the first coil C1.

As illustrated in FIG. 4A, the upper surface of the signal lead 28*a* is connected with the upper surface (a pad) of the first semiconductor chip 61 by the wire W1. As a result, the first coil C1 is electrically connected with the first semiconductor chip 61.

When viewed in plan, the signal lead 28*a* extends from the signal terminal portion 14*sa* and the first side s1 of the substrate 10 (see FIG. 2) toward the first semiconductor chip 61 along the X-direction.

For example, as illustrated in FIG. 4B, the substrate 10 further includes an upper conductive part 52*a*. At least a portion of the upper conductive part 52*a* is located inside the substrate 10 (inside the insulating layer 11). The upper conductive part 52*a* includes a terminal portion 54*a* positioned at an opening 53*a* provided in the upper surface 10*t* of the substrate 10. The upper conductive part 52*a* is electrically connected with one end portion C2*a* of the second coil C2. The terminal portion 54*a* of the upper conductive part 52*a* is connected with the upper surface (a pad) of the second semiconductor chip 62 by the wire W3. As a result, the second coil C2 is electrically connected with the second semiconductor chip 62.

Figure 5A:
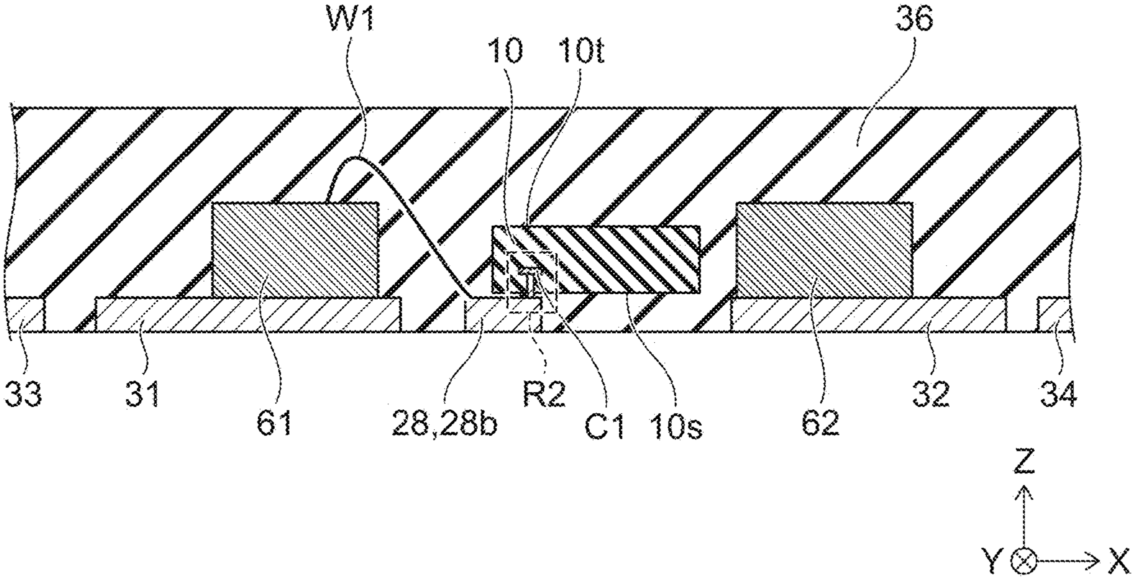
FIGS. 5A and 5B are schematic cross-sectional views illustrating the isolator according to the embodiment.
Figure 5B:
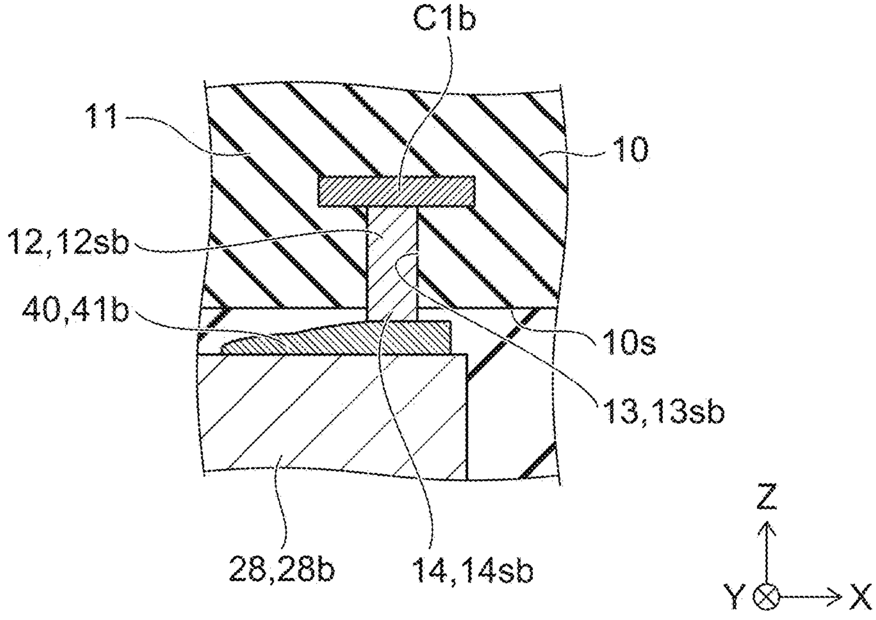

FIGS. 5A and 5B are schematic cross-sectional views illustrating the isolator according to the embodiment.

FIG. 5A corresponds to a line A11-A12 cross section shown in FIG. 1. FIG. 5B corresponds to an enlarged view of the vicinity of region R2 shown in FIG. 5A.

As illustrated in FIG. 5B, the multiple conductive parts 12 include a signal conductive part 12*sb*. The signal conductive part 12*sb* includes the terminal portion 14 (a signal terminal portion 14*sb*) positioned at the opening 13 (a signal opening 13*sb*) provided in the lower surface 10*s* of the substrate 10.

The signal conductive part 12*sb* is electrically connected with another end portion C1*b* of the first coil C1. The signal lead 28 (a signal lead 28*b*) is connected with the signal terminal portion 14*sb* by the solder 40 (solder 41*b*). As a result, the signal lead 28*b* is electrically connected with the first coil C1.

As illustrated in FIG. 5A, the upper surface of the signal lead 28*b* is connected with the upper surface (a pad) of the first semiconductor chip 61 by the wire W1. As a result, the first coil C1 electrically connected with the first semiconductor chip 61.

When viewed in plan, the signal lead 28*b* extends from the signal terminal portion 14*sb* and the first side s1 of the substrate 10 (see FIG. 2) toward the first semiconductor chip 61 along the X-direction.

Figure 6A:
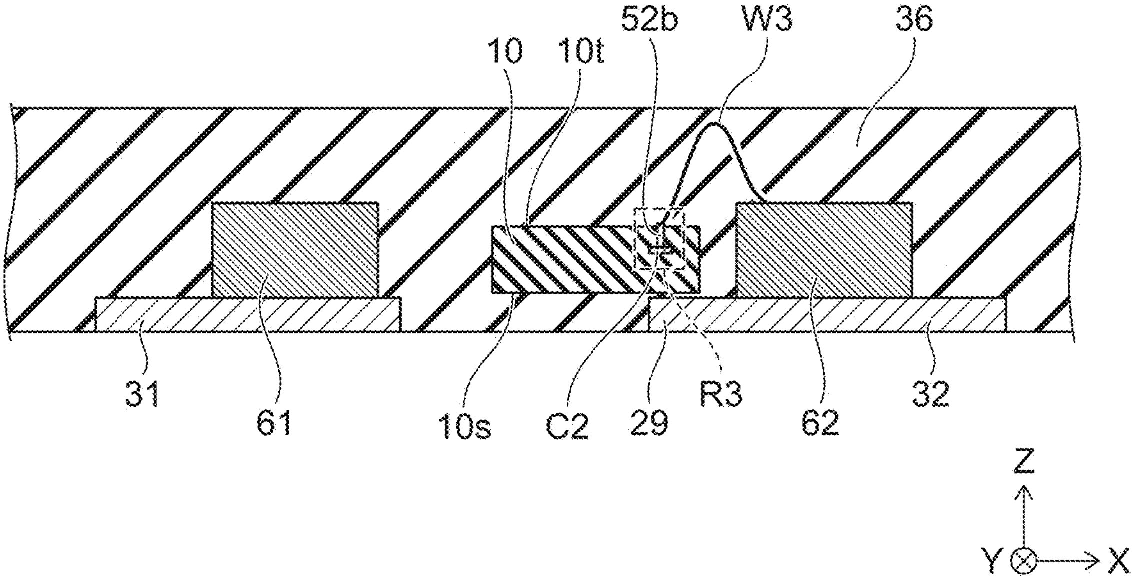
FIGS. 6A and 6B are schematic cross-sectional views illustrating the isolator according to the embodiment.
Figure 6B:
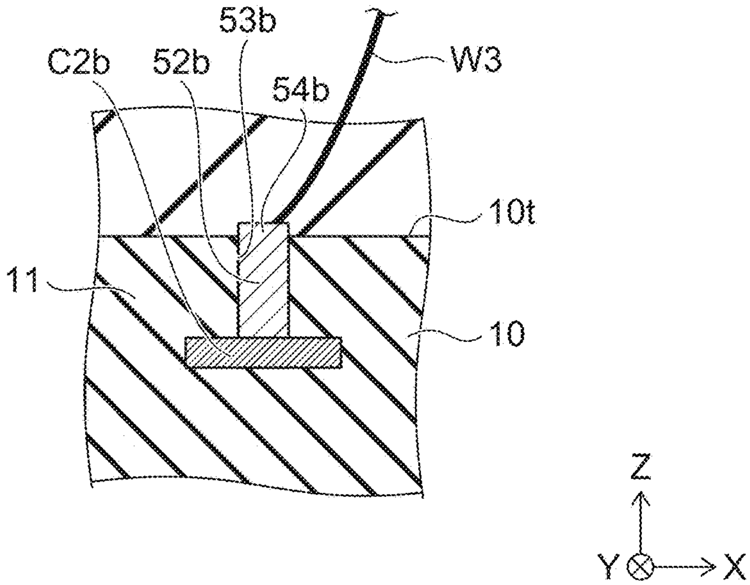

FIGS. 6A and 6B are schematic cross-sectional views illustrating the isolator according to the embodiment.

FIG. 6A corresponds to a line A13-A14 cross section shown in FIG. 1. FIG. 6B corresponds to an enlarged view of the vicinity of region R3 shown in FIG. 6A.

As illustrated in FIG. 6B, the substrate 10 further includes an upper conductive part 52*b*. At least a portion of the upper conductive part 52*b* is located inside the substrate 10 (inside the insulating layer 11). The upper conductive part 52*b* includes a terminal portion 54*b* positioned at an opening 53*b* provided in the upper surface 10*t* of the substrate 10. The upper conductive part 52*b* is electrically connected with another end portion C2*b* of the second coil C2. The terminal portion 54*b* of the upper conductive part 52*b* is connected with the upper surface (a pad) of the second semiconductor chip 62 by the wire W3. As a result, the second coil C2 is electrically connected with the second semiconductor chip 62.

As illustrated in FIG. 6A, a support lead 29 may be located below the substrate 10. The support lead 29 is positioned below the upper conductive part 52*b*. The support lead 29 can support the substrate 10 from below when the wire W3 is connected to the upper conductive part 52*b*. The support lead 29 may not be connected with a conductive part by solder.

Figure 7:
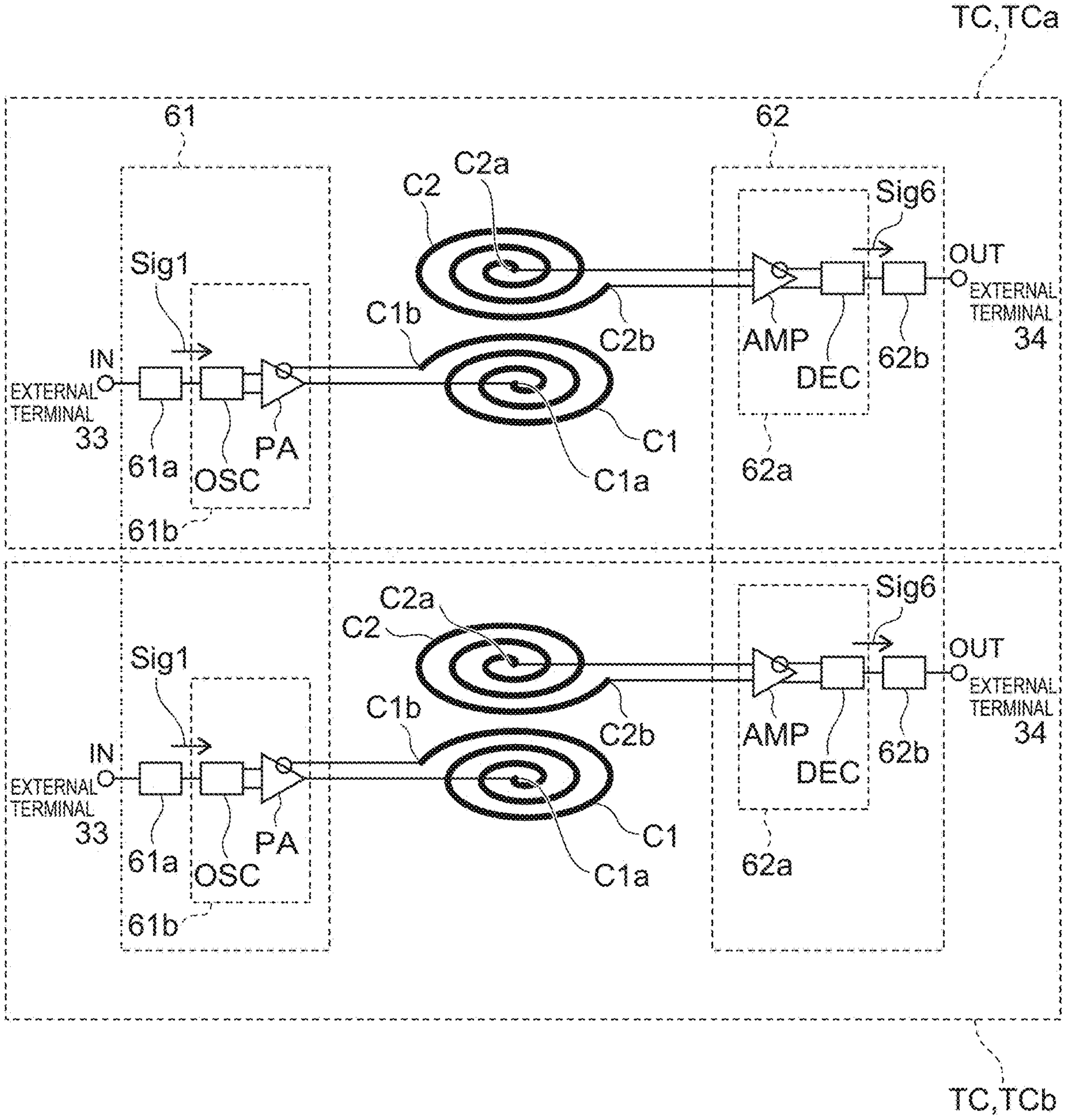
FIG. 7 is a schematic view illustrating a circuit configuration of the isolator according to the embodiment.

FIG. 7 is a schematic view illustrating a circuit configuration of the isolator according to the embodiment.

In the isolator 100, for example, the transmitting-side circuit (the primary circuit) and the receiving-side circuit (the secondary circuit) are insulated from each other. The coil that is connected to the transmitting-side circuit and the coil that is connected to the receiving-side circuit are magnetically coupled. As a result, a signal can be transmitted from the transmitting-side circuit to the receiving-side circuit.

In the example, the isolator 100 has two channels. In each channel, the isolator 100 transmits a signal from the transmitting-side circuit to the receiving-side circuit in a state in which the transmitting-side circuit and the receiving-side circuit are insulated from each other. The isolator 100 may be an isolator with one channel, or may be an isolator with three or more channels.

The isolator 100 includes a transmission circuit TC. One transmission circuit TC corresponds to one channel. In the example, two transmission circuits TC (a first transmission circuit TCa and a second transmission circuit TCb) are included. The first transmission circuit TCa transmits signals corresponding to a first channel. The second transmission circuit TCb transmits signals corresponding to a second channel.

Each transmission circuit TC includes the external terminal 33, an electronic circuit 61*a*, a transmitting circuit 61*b*, the first coil C1, the second coil C2, a receiving circuit 62*a*, an electronic circuit 62*b*, and the external terminal 34.

The electronic circuit 61*a* and the transmitting circuit 61*b* are formed in the first semiconductor chip 61. The first semiconductor chip 61 is, for example, an IC (Integrated Circuit) chip. The first semiconductor chip 61 corresponds to the transmitting-side circuit. For example, a power supply voltage and a grounding voltage are supplied to the first semiconductor chip 61. As described above in FIGS. 4B and 5B, the transmitting circuit 61*b* is electrically connected with the one end portion C1*a* and the other end portion C1*b* of the first coil C1 via the wire W1 and the signal lead 28.

The receiving circuit 62*a* and the electronic circuit 62*b* are formed in the second semiconductor chip 62. The second semiconductor chip 62 is, for example, an IC chip. The second semiconductor chip 62 corresponds to the receiving-side circuit. For example, a power supply voltage and a grounding voltage are supplied to the second semiconductor chip 62. As described above in FIGS. 4B and 6B, the receiving circuit 62*a* is electrically connected with the one end portion C2*a* and the other end portion C2*b* of the second coil C2 via the wire W3.

An input signal IN from the outside is input to the external terminal 33. The electronic circuit 61*a* includes, for example, a modulation circuit. The electronic circuit 61*a* modulates (e.g., performs amplitude-shift keying of) the input signal IN received from the outside via the external terminal 33, and transmits a modulated signal Sig1 to the transmitting circuit 61*b*.

The transmitting circuit 61*b* includes, for example, an oscillator OSC and a power amplifier PA. The oscillator OSC generates an inverted signal of the signal Sig1 based on the signal Sig1 received from the electronic circuit 61*a*, and transmits the generated inverted signal to the power amplifier PA. The oscillator OSC transmits the received signal Sig1 as a non-inverted signal to the power amplifier PA.

The power amplifier PA amplifies the non-inverted signal received from the oscillator OSC, and transmits the amplified non-inverted signal to one end of the first coil C1. The power amplifier PA amplifies the inverted signal received from the oscillator OSC and transmits the amplified inverted signal to the other end of the first coil C1.

When the first coil C1 receives the inverted signal and the non-inverted signal from the power amplifier PA, a current that corresponds to the received inverted signal and non-inverted signal flows in the first coil C1. As a result, the first coil C1 generates a magnetic field. Then, the magnetic flux that extends through the second coil C2 changes. As a result, a current (an induced current) flows in the second coil C2.

Based on the current flowing in the second coil C2, the non-inverted signal is input from one end of the second coil C2 to the receiving circuit 62*a*; and the inverted signal is input from the other end of the second coil C2 to the receiving circuit 62*a*.

The receiving circuit 62*a* includes, for example, an amplifier AMP and a wave detecting circuit DEC. The amplifier AMP amplifies the inverted signal received from the second coil C2, and transmits the amplified inverted signal to the wave detecting circuit DEC. The amplifier AMP amplifies the non-inverted signal received from the second coil C2, and transmits the amplified non-inverted signal to the wave detecting circuit DEC.

The wave detecting circuit DEC detects the non-inverted signal based on the non-inverted signal and inverted signal received from the amplifier AMP. The wave detecting circuit DEC transmits the detected non-inverted signal as a signal Sig6 to the electronic circuit 62*b*.

The electronic circuit 62*b* includes, for example, a demodulation circuit. The electronic circuit 62*b* demodulates the signal Sig6 received from the wave detecting circuit DEC, and outputs the demodulated signal as an output signal OUT to the outside via the external terminal 34.

Thus, the isolator 100 (the transmission circuit TC) converts the signal transmitted to the first coil C1 by the first semiconductor chip 61 (the transmitting circuit) into magnetic energy via the first coil C1. Then, the isolator 100 reconverts the magnetic energy into a signal (an electrical signal) via the second coil C2, and transmits the converted signal to the second semiconductor chip 62 (the receiving circuit). The second semiconductor chip 62 outputs an output signal corresponding to the signal received from the second coil C2. Thus, the isolator 100 transmits a signal from the first semiconductor chip 61 to the second semiconductor chip 62 via multiple coils in a state in which the first semiconductor chip 61 and the second semiconductor chip 62 are insulated from each other.

For example, a low-voltage circuit driven by a low voltage may be connected to the first semiconductor chip 61 side; and a high-voltage circuit driven by a voltage that is higher than that of the low-voltage circuit may be connected to the second semiconductor chip 62 side. The circuit configuration illustrated in FIG. 7 is an example; and the embodiment is not limited to such a circuit configuration. It is sufficient for the embodiment to be configured to transmit a signal between the first semiconductor chip 61 and the second semiconductor chip 62 via multiple coils in a state in which the first semiconductor chip 61 and the second semiconductor chip 62 are insulated from each other.

In the example, the first semiconductor chip 61 at the transmitting side is electrically connected with the first coil C1 via the lead 20 (the signal lead 28). On the other hand, the second semiconductor chip 62 at the receiving side is electrically connected with the second coil C2 without using the lead 20.

Materials of the components of the embodiment will now be described.

The lead 20 (the first to fourth leads 21 to 24 and the signal lead 28), the support lead 29, the die pad 31, the die pad 32, the external terminal 33, and the external terminal 34 have, for example, thin plate shapes including metals such as copper, etc. The wires W1 to W4 are, for example, metal wires including gold (Au), silver (Ag), or copper (Cu). The first coil C1 and the second coil C2 include, for example, metals such as copper, etc. The insulating layer 11 of the substrate 10 includes, for example, a resin. More specifically, the insulating layer 11 includes a polyimide or epoxy resin. The substrate 10 is, for example, an FPC (flexible printed circuit) substrate or glass epoxy substrate. The substrate 10 may be flexible. The insulating part 36 (the sealing resin) includes, for example, an epoxy resin.

The structure and operations of the isolator 100 according to the embodiment are as described above.

However, in an isolator, there are cases where defects may occur such as rotation or misalignment (rotation or translation in the X-Y plane) of the substrate that includes the coils. When such a defect occurs, for example, a defect may occur in the electrical connection of the wires and/or solder. For example, there is a risk that a short defect or open defect may occur.

In contrast, in the isolator 100 according to the embodiment, the first to fourth leads 21 to 24 are connected by solder to the terminal portions 14 of the substrate 10. Thus, by connecting the leads at multiple positions, at least one of rotation or misalignment of the substrate 10 can be suppressed. As a result, electrical defects between the first to fourth leads 21 to 24 and the terminal portions 14 of the substrate 10 can be suppressed, and so a highly reliable isolator 100 can be obtained.

Figure 8A:
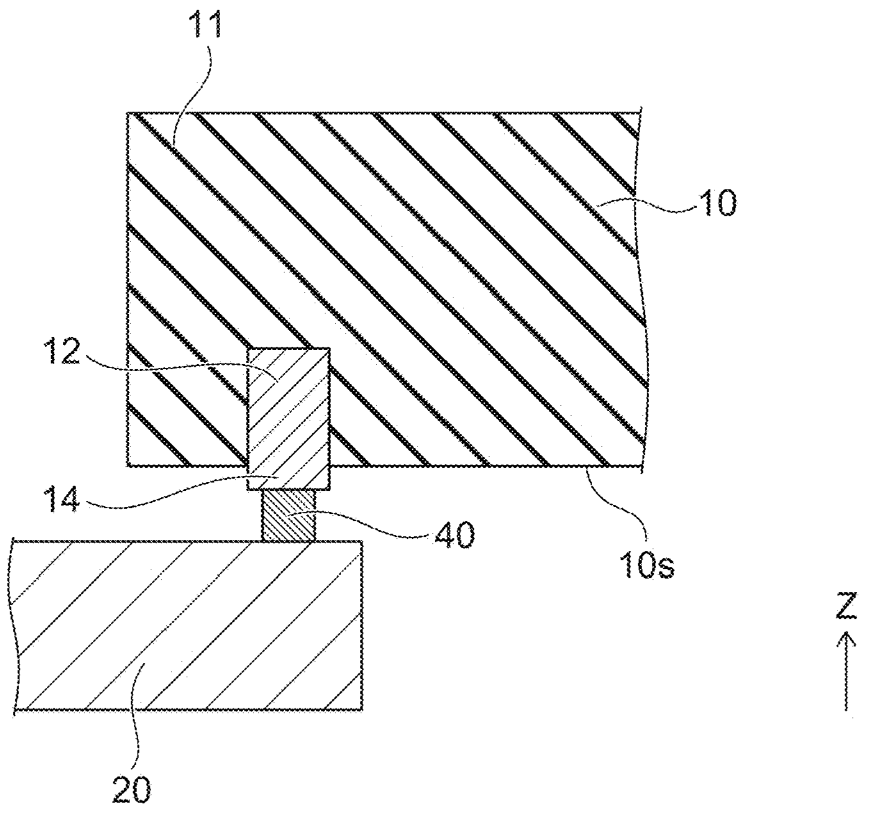
FIGS. 8A and 8B are schematic cross-sectional views illustrating a portion of the isolator according to the embodiment.
Figure 8B:
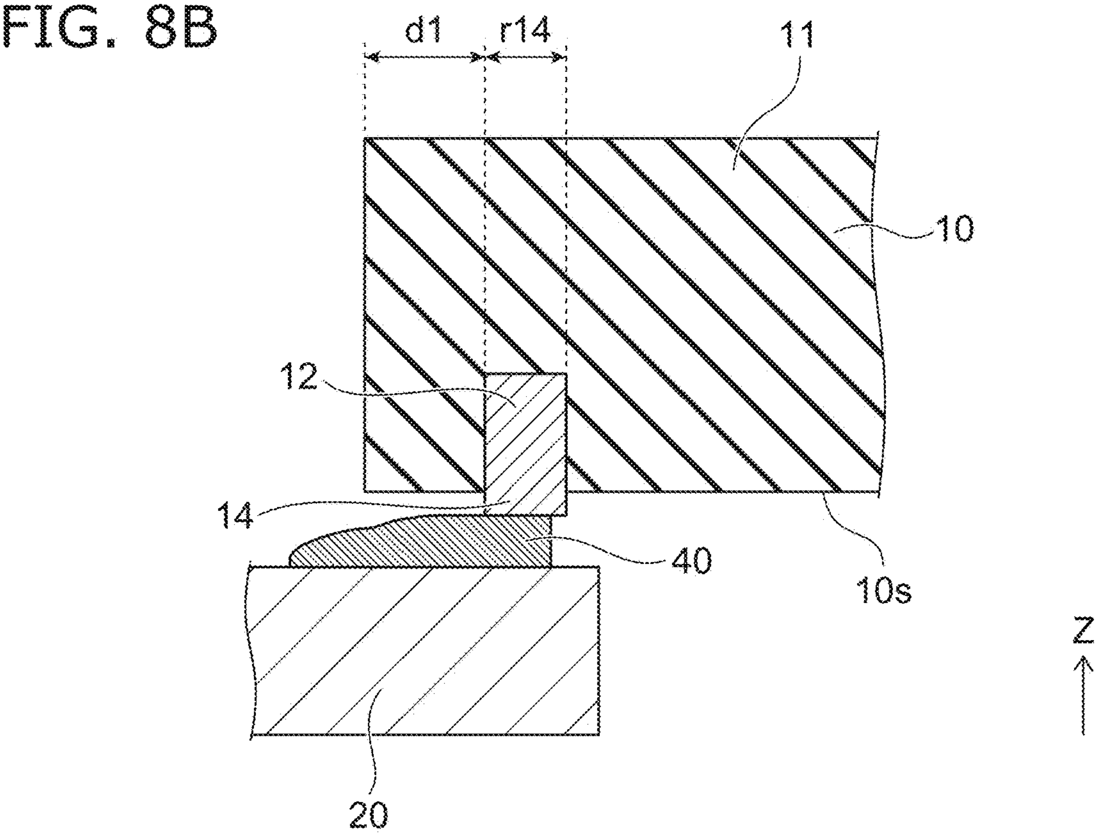

FIGS. 8A and 8B are schematic cross-sectional views illustrating a portion of the isolator according to the embodiment.

When manufacturing the isolator 100, the solder 40 connects the lead 20 and the terminal portion 14 by, for example, a reflow process. Namely, for example, the multiple terminal portions 14 are mounted respectively on the multiple leads 20 via the solder 40. Then, the multiple leads 20 on which the terminal portions 14 are mounted are heated in, for example, a reflow furnace. The leads 20 and the terminal portions 14 are solder bonded by the solder being heated, melted, and then solidified by cooling. FIG. 8A illustrates the state before heating the solder 40 in the manufacture of the isolator 100. FIG. 8B illustrates an example of the state after heating the solder 40.

When the solder 40 is heated, the insulating layer 11 of the substrate 10 repels the solder 40. On the other hand, the solder 40 easily wets onto metal; therefore, when the solder 40 is heated, there are cases where the solder 40 wets and spreads by flowing over the lead 20 as illustrated in FIG. 8B. A force is applied to the substrate 10 by the flow of the solder 40. Therefore, rotation or misalignment of the substrate 10 may occur. In contrast, in the isolator 100 according to the embodiment includes the first to fourth terminal portions 14*a* to 14*d* to which the first to fourth leads 21 to 24 are connected by solder. As a result, at least one of rotation or misalignment of the substrate 10 can be further suppressed. For example, a force due to the surface tension of the melted solder acts on the substrate 10. For example, the force from the solder 40 pulls the substrate 10 in a balanced fashion. For example, at least a portion of the force applied to the substrate 10 by the solder 40 on the multiple leads 20 is balanced.

It is desirable to locate the first to fourth terminal portions 14*a* to 14*d* respectively at the corner vicinities of the substrate 10 (within ranges of the first to fourth corner portions cr1 to cr4). As a result, Θ rotation of the substrate 10 in the solder reflow can be further suppressed.

As illustrated in FIG. 8B, a distance d1 from the outer edge of the substrate 10 to the terminal portion 14 may be greater than a diameter r14 (the maximum length in the X-Y plane) of the terminal portion 14. The terminal portion 14 is easily disposed inside the lower surface 10*s* of the substrate 10. Or, the distance d1 may be less than the diameter r14. For example, interference of the terminal portion 14 with other wiring parts and the like located in the substrate 10 can be suppressed. The distance d1 is, for example, not less than 50 μm (micrometers). When viewed in plan, the first to fourth terminal portions 14*a* to 14*d* (and the first to fourth corner portions cr1 to cr4) each may be positioned on diagonals of the substrate 10.

For example, at least a portion of the first to fourth terminal portions 14*a* to 14*d* may be terminal portions not used for conduction. As a result, for example, the arrangement of the first to fourth terminal portions 14*a* to 14*d* is easily designed. By including terminal portions not used for conduction, terminals that are insufficient to suppress the @ rotation of the substrate 10 can be compensated.

At least a portion of the four terminal portions (14*a*, 14*b*, 14*c*, and 14*d*) may not always be a terminal not used for conduction. At least a portion of the four terminal portions (14*a*, 14*b*, 14*c*, and 14*d*) may be electrically connected with the first semiconductor chip 61 or the second semiconductor chip 62 and may transmit an electrical signal flowing in the first semiconductor chip 61 or the second semiconductor chip 62.

Figure 9A:
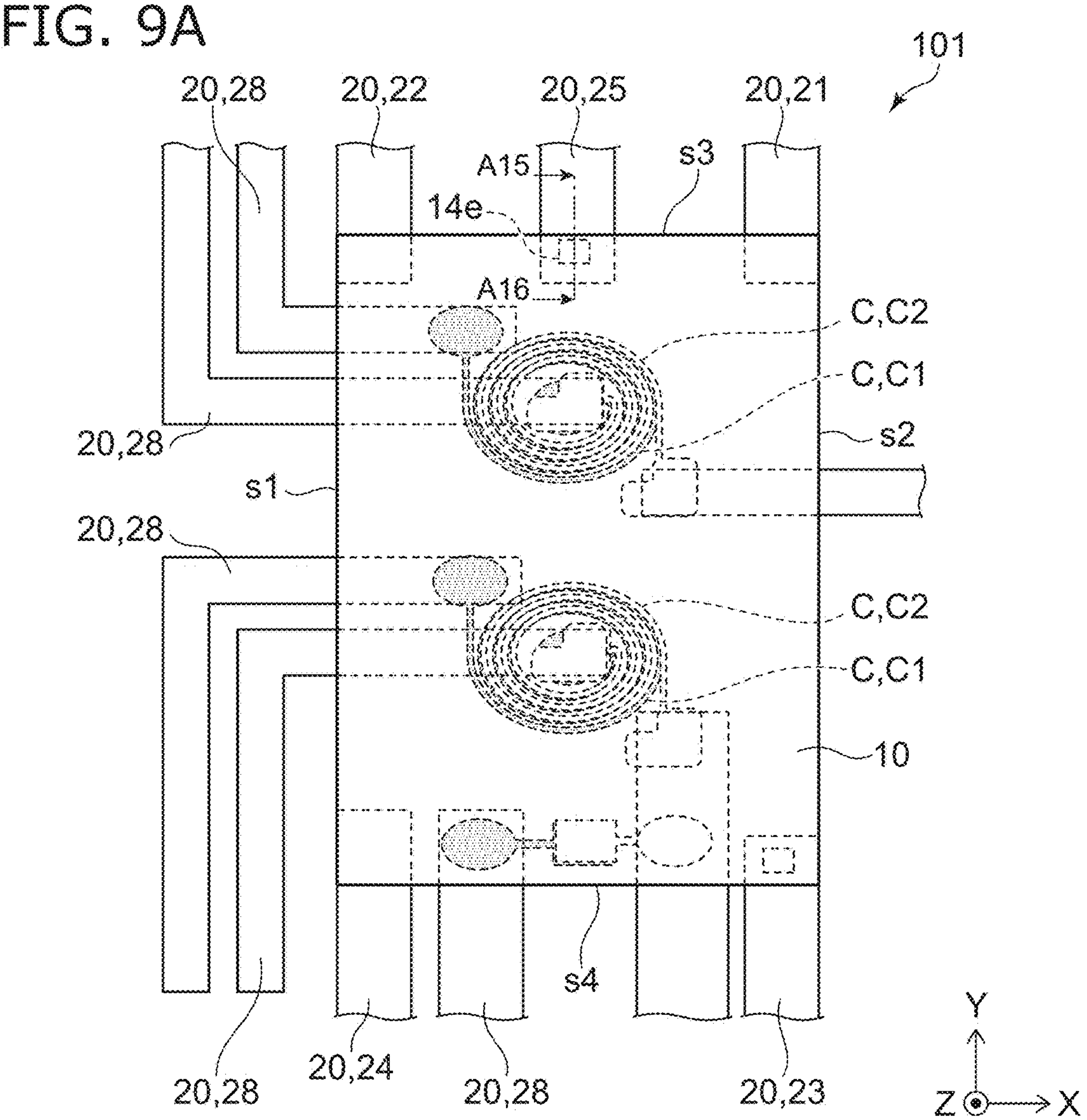
FIGS. 9A and 9B are schematic plan views illustrating a portion of an isolator according to a modification of the embodiment.
Figure 9B:
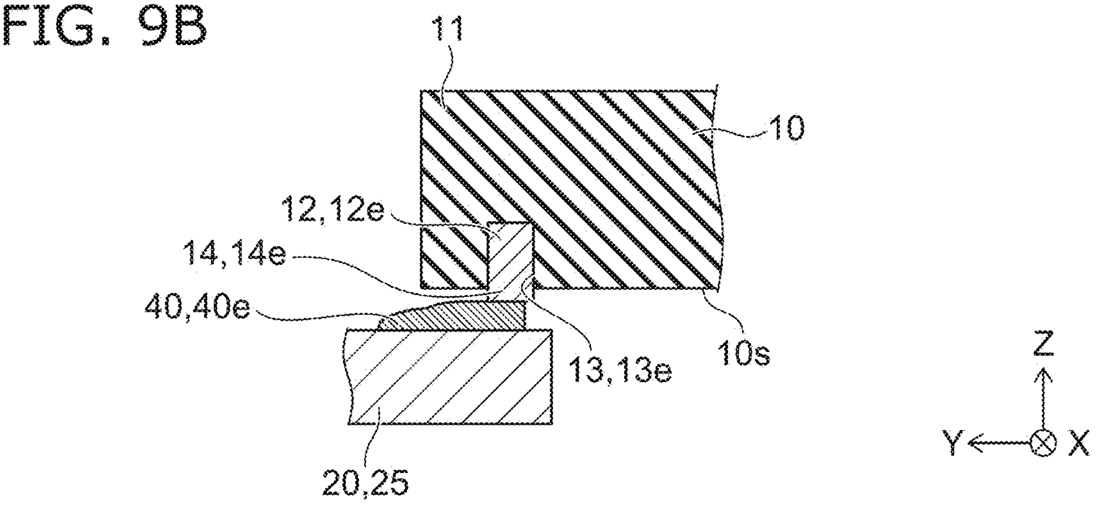

FIGS. 9A and 9B are schematic plan views illustrating a portion of an isolator according to a modification of the embodiment.

FIG. 9B corresponds to a line A15-A16 cross section illustrated in FIG. 9A. The isolator 101 according to the embodiment illustrated in FIGS. 9A and 9B differs from the isolator 100 described above in that a fifth lead 25 and a fifth conductive part 12*e* are included. Otherwise, the isolator 101 is similar to the isolator 100.

As illustrated in FIG. 9B, the multiple conductive parts 12 further include the fifth conductive part 12*e*. The fifth conductive part 12*e* includes a fifth terminal portion 14*e* positioned at an opening 13*e* provided in the lower surface 10*s* of the substrate 10.

In the example as illustrated in FIG. 9A, when viewed in plan, the fifth lead 25 extends from the fifth terminal portion 14*e* and the third side s3 in the +Y direction. In the example, the fifth lead 25 overlaps the center of the third side s3 in the X-direction.

In the example illustrated in FIG. 9B, the portion of the fifth conductive part 12*e* other than the fifth terminal portion 14*e* is covered with the insulating layer 11. For example, the entire surface of the portion of the fifth conductive part 12*e* other than the fifth terminal portion 14*e* contacts the insulating layer 11. The fifth conductive part 12*e* may be electrically insulated from the other conductive parts and/or elements located inside the substrate 10. For example, the fifth conductive part 12*e* may be electrically insulated from the multiple coils C. In other words, the fifth conductive part 12*e* may be a conductive part 12 not used for conduction. The fifth conductive part 12*e* may not contact components other than the insulating layer 11 inside the substrate 10.

The multiple leads 20 further include the fifth lead 25. The fifth lead 25 is connected with the fifth terminal portion 14*e* by solder 40*e*. The fifth lead 25 may be electrically insulated from the first and second semiconductor chips 61 and 62. The fifth lead 25 may be electrically insulated from elements (the multiple coils C, etc.) located inside the substrate 10. In other words, the fifth lead 25 may be a lead 20 that is not used for conduction. For example, the fifth lead 25 may not contact conductive members other than the solder 40. The potentials of the fifth lead 25 and the fifth conductive part 12*e* may be electrically floating.

Thus, the fifth terminal portion 14*e* to which the fifth lead 25 is connected by solder may be included. For example, the fifth terminal portion 14*e* cancels at least a portion of the force that is applied to the terminal portions (the signal terminal portion 14*sa* and the signal terminal portion 14*sb*) used for conduction and moves the substrate 10 when solder wets and spreads. At least one of rotation or misalignment of the substrate 10 can be further suppressed.

According to the embodiment, the numbers of leads 20 and conductive parts 12 not used for conduction are not limited to four or five, and may be one or more, or six or more.

Figure 10:
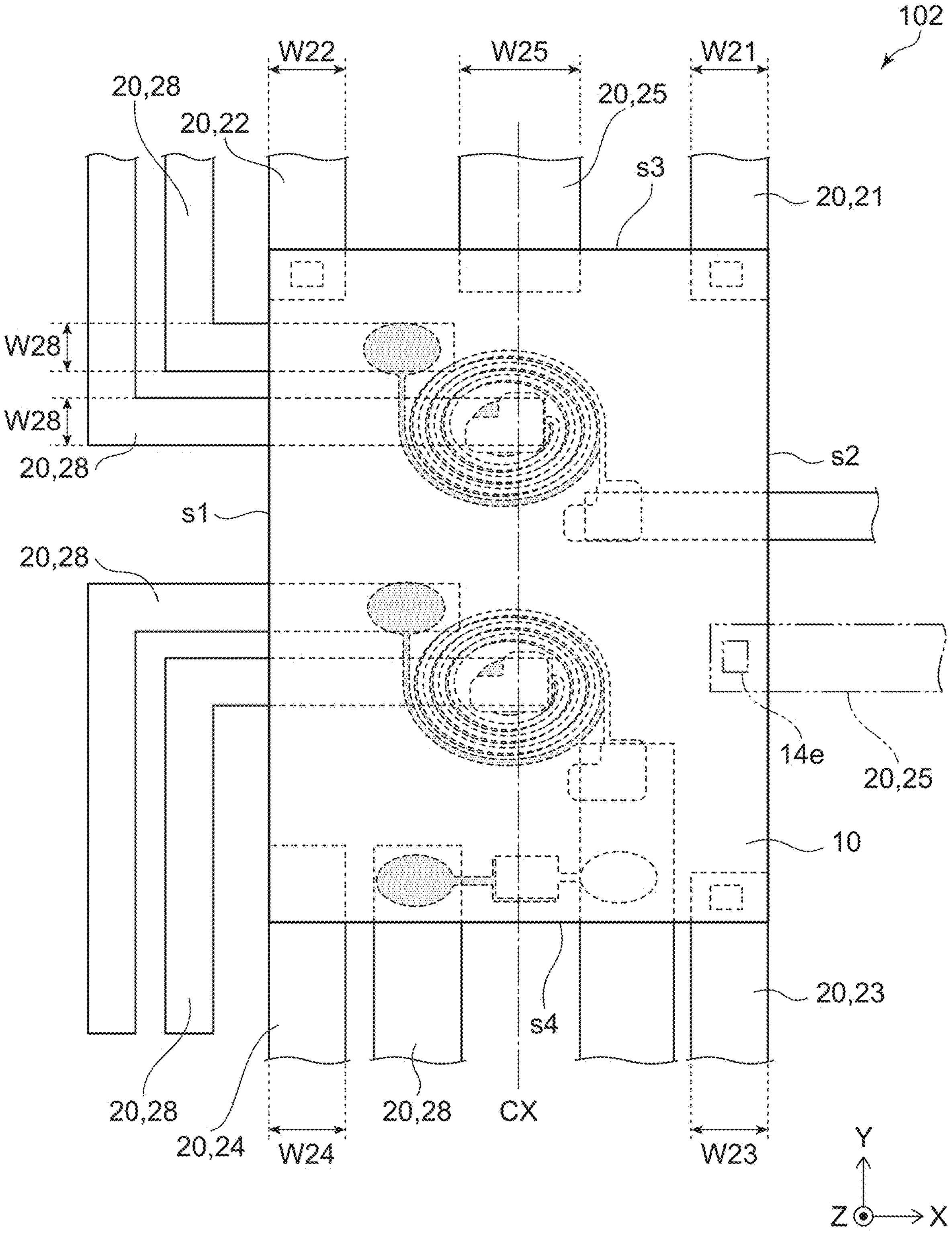
FIG. 10 is a schematic plan view illustrating a portion of an isolator according to a modification of the embodiment.

FIG. 10 is a schematic plan view illustrating a portion of an isolator according to a modification of the embodiment.

The width of the lead 20 of the isolator 102 according to the embodiment illustrated in FIG. 10 is different from that of the isolator 101 described above. Otherwise, the isolator 102 is similar to the isolator 101.

According to the embodiment, the width of the lead 20 can be adjusted as appropriate. The width of the lead 20 is the length in the transverse direction of the lead 20 when viewed in plan. In the isolator 102, a width W25 (the X-direction length) of the fifth lead 25 is different from a width W21 (the X-direction length) of the first lead 21.

Figure 11A:
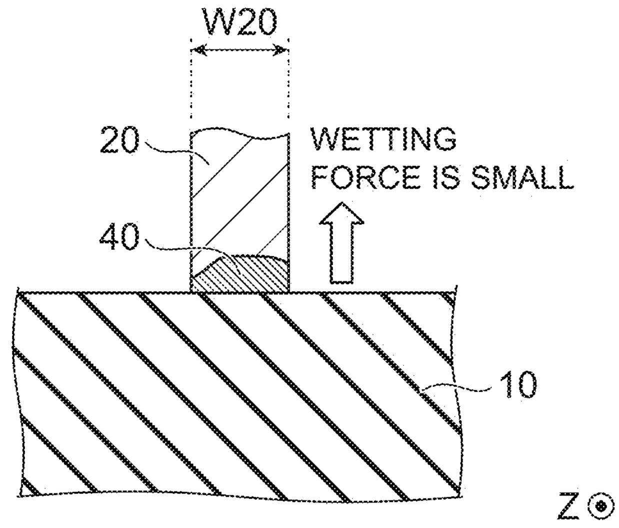
FIGS. 11A and 11B are schematic plan views illustrating the periphery of the lead of the isolator according to the embodiment.
Figure 11B:
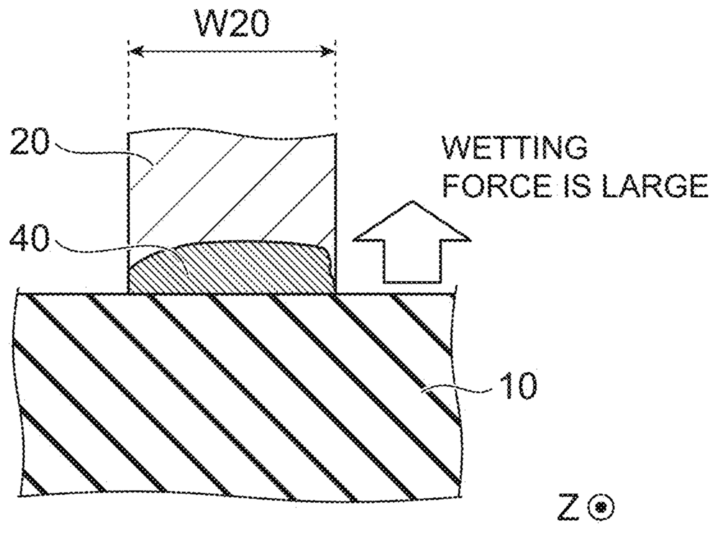

FIGS. 11A and 11B are schematic plan views illustrating the periphery of the lead of the isolator according to the embodiment.

FIG. 11A shows when a width W20 of the lead 20 is narrow. FIG. 11B shows when the width W20 of the lead 20 is greater than that of FIG. 11A. As illustrated in FIGS. 11A and 11B, for example, the width that the solder 40 wets and spreads is widely when the width W20 is wide; and the width that the solder 40 wets and spreads is narrow when the width W20 is narrow.

For example, when the width W20 is wide, the force that moves the substrate 10 when the solder 40 wets and spreads is large; and when the width W20 is narrow, the force that moves the substrate 10 when the solder 40 wets and spreads is small. By adjusting the width W20, at least a portion of the force that is applied to the terminal portions used for conduction and moves the substrate 10 when the solder 40 wets and spreads is canceled. At least one of rotation or misalignment of the substrate 10 can be further suppressed.

In FIG. 10 above, the width W25 of the fifth lead 25 is greater than the width W21 of the first lead 21. However, the width W25 may be less than the width W21. The width W25 may be equal to the width W21.

In the example of FIG. 10, the width W21 of the first lead 21, a width W22 (the X-direction length) of the second lead 22, a width W23 (the X-direction length) of the third lead 23, and a width W24 (the X-direction length) of the fourth lead 24 are equal. The widths are not limited thereto; the width W21, the width W22, the width W23, and the width W24 may be different from each other. For example, the widths W20 of the leads 20 can be adjusted according to the arrangement of the leads 20.

For example, when viewed in plan, the multiple leads 20 include a lead 20 (called the "first-side lead") located at the first side s1 side of the substrate 10, and a lead 20 (called the "second-side lead") located at the second side s2 side of the substrate 10.

The first-side lead extends from the outer edge of the substrate 10 at the first side s1 side of the center CX of the substrate 10 in the X-direction when viewed in plan. More specifically, in the example of FIG. 10, the second lead 22, the fourth lead 24, and the signal lead 28 are first-side leads.

The second-side lead extends from the outer edge of the substrate 10 at the second side s2 side of the center CX of the substrate 10 in the X-direction when viewed in plan. More specifically, in the example of FIG. 10, the first lead 21 and the third lead 23 are second-side leads.

The number of first-side leads and the number of second-side leads may be different from each other. In the example of FIG. 10, the number of second-side leads is less than the number of first-side leads. In such a case, for example, the width of at least one of the second-side leads may be greater than the width of at least one of the first-side leads. For example, the width W21 may be greater than the widths W22 and W24. For example, the width W23 may be greater than the widths W22 and W24. However, the widths are not limited thereto; the width W21 may be less than the widths W22 and W24; and the width W23 may be less than the widths W22 and W24.

For example, a width W28 (the Y-direction length) of the signal lead 28 may be less than at least one of the width W21, the width W22, the width W23, or the width W24.

The fifth lead 25 overlaps the center of the third side s3 in the Z-direction and extends from the third side s3 in the Y-direction. The fifth lead 25 is not limited thereto; for example, the fifth lead 25 may be located at the second side s2 side. In other words, the fifth lead 25 may be a second-side lead. For example, as illustrated by a double dot-dash line in FIG. 10, the fifth lead 25 may be arranged to overlap the second side s2 in the Z-direction, and may extend from the second side s2 in the X-direction. In such a case, the fifth terminal portion 14*e* is located proximate to the second side s2.

Figure 12A:
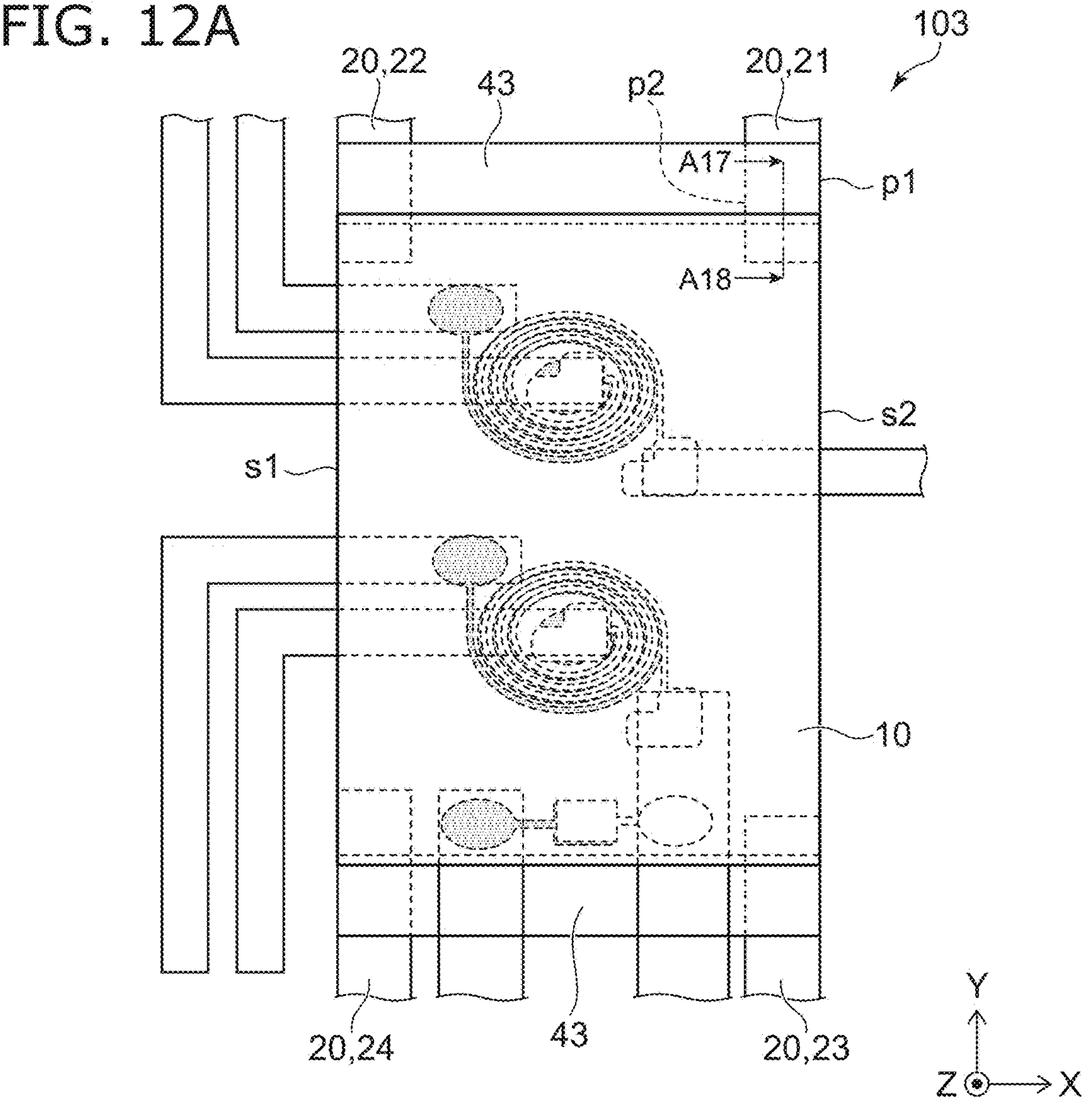
FIGS. 12A and 12B are schematic plan views illustrating a portion of an isolator according to the embodiment.
Figure 12B:
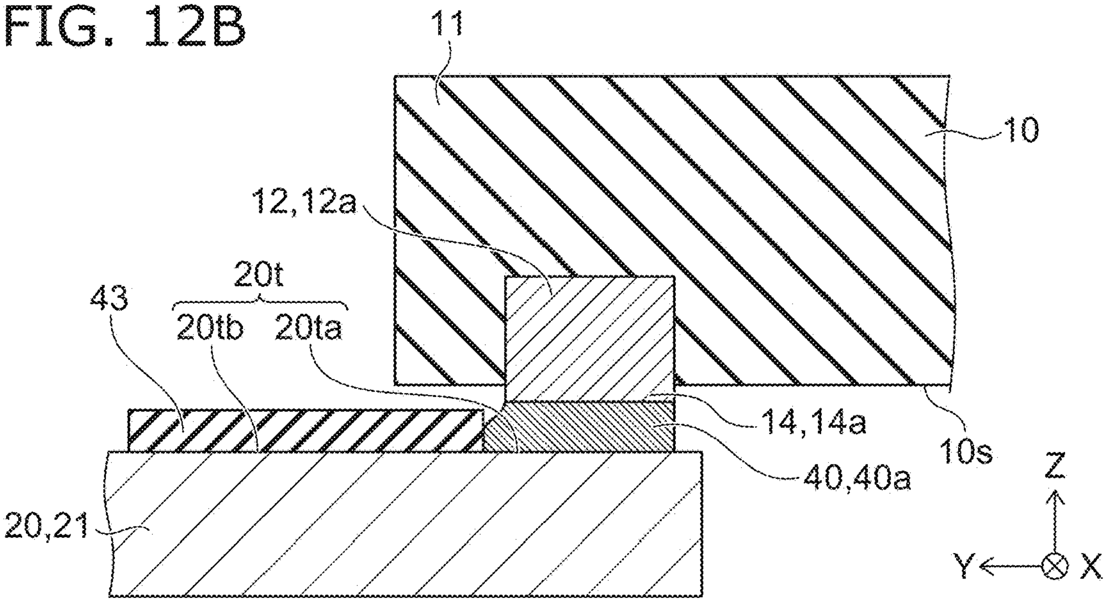

FIGS. 12A and 12B are schematic plan views illustrating a portion of an isolator according to the embodiment.

The isolator 103 illustrated in FIGS. 12A and 12B differs from the isolator 100 described above in that an insulating member 43 (e.g., insulating tape) is included. Otherwise, the isolator 103 is similar to the isolator 100.

FIG. 12B corresponds to a line A17-A18 cross section illustrated in FIG. 12A. As illustrated in FIG. 12B, an upper surface 20*t* of the lead 20 includes a connection region 20*ta* and an adjacent region 20*tb*. The connection region 20*ta* contacts the solder 40. The connection region 20_ta_ is positioned below the substrate 10. The connection region 20_ta_ overlaps the terminal portion 14 and the substrate 10 in the Z-direction. The adjacent region 20_tb_ is adjacent to the connection region 20_ta_ and does not contact the solder 40. The adjacent region 20_tb_ may or may not include a portion overlapping the substrate 10 in the Z-direction.

The insulating member 43 is located on the adjacent region 20_tb_. For example, insulating tape is adhered on the adjacent region 20_tb_. The insulating member 43 includes, for example, a resin such as polyimide, etc. By including the insulating member 43, the wetting and spreading of the solder 40 can be suppressed. At least one of rotation or misalignment of the substrate 10 can be further suppressed.

As illustrated in FIG. 12B, the end portion of the insulating member 43 may overlap the substrate 10 in the Z-direction. For example, the end portion of the insulating member 43 contacts the solder 40.

For example, the insulating member 43 is located on at least one of the first to fourth leads 21 to 24. When the first to fourth leads 21 to 24 are leads not used for conduction, the design constraints can be reduced, and the insulating member 43 can be disposed relatively easily. For example, as illustrated in FIG. 12A, one insulating member 43 may be continuous from the top of the first lead 21 to the top of the second lead 22. For example, one other insulating member 43 may be continuous from the top of the third lead 23 to the top of the fourth lead 24. The insulating member 43 covers the leads 20 to which the insulating member 43 is adhered from one end p1 to another end p2 in the width direction.

Figures 13A, 13B:
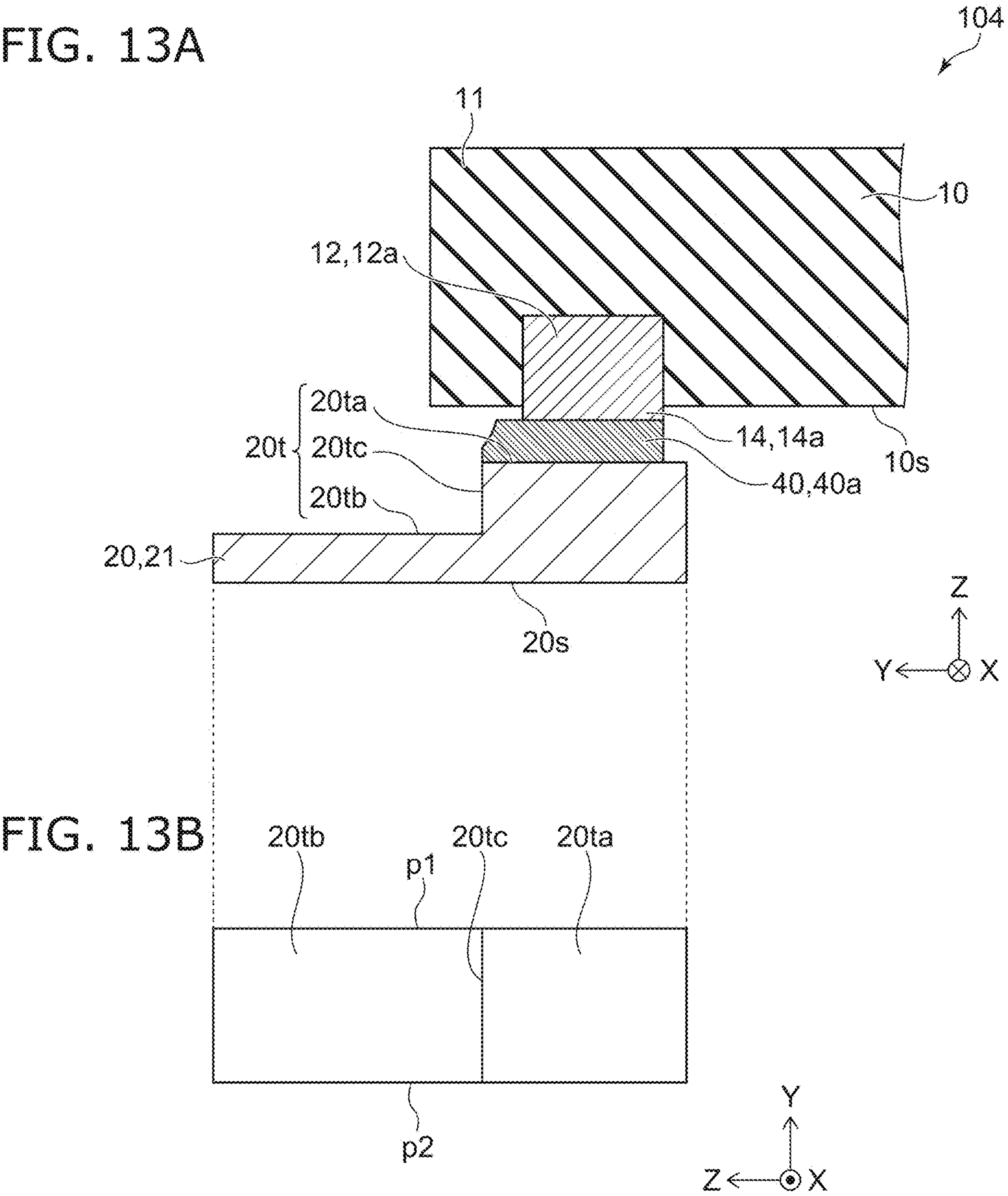
FIGS. 13A and 13B are a schematic cross-sectional view and a schematic plan view illustrating a portion of an isolator according to the embodiment.

FIGS. 13A and 13B are a schematic cross-sectional view and a schematic plan view illustrating a portion of an isolator according to the embodiment.

The shape of the lead 20 of the isolator 104 illustrated in FIGS. 13A and 13B differs from that of the isolator 100 described above. Otherwise, the isolator 104 is similar to the isolator 100. FIG. 13A corresponds to a cross section similar to FIG. 3A. FIG. 13B is a plan view of the lead 20 illustrated in FIG. 13A viewed along the Z-direction.

As illustrated in FIG. 13A, the upper surface 20_t_ of the lead 20 (e.g., the first lead 21) includes the connection region 20_ta_ that contacts the solder 40, the adjacent region 20_tb_ that does not contact the solder 40, and a step portion (a step) 20_tc_ between the connection region 20_ta_ and the adjacent region 20_tb_. The step portion 20_tc_ extends along the Z-direction and is a connection surface that connects the connection region 20_ta_ and the adjacent region 20_tb_. A lower surface 20_s_ of the lead 20 may be flat. The portion of the lead 20 that includes the adjacent region 20_tb_ is thinner than the portion of the lead 20 that includes the connection region 20_ta_. As illustrated in FIG. 13B, the step portion 20_tc_ is continuous from the one end p1 to the other end p2 of the lead 20 in the width direction.

By including the step portion 20_tc_, the solder 40 does not flow outward easily due to surface tension in reflow. At least one of rotation or misalignment of the substrate 10 can be further suppressed thereby.

For example, such a step portion 20_tc_ is provided in at least one of the first to fourth leads 21 to 24. On the other hand, the upper surface 20_t_ of the signal lead 28 may not include the step portion 20_tc_ and may be flat. The thickness of the signal lead 28 may be constant.

The embodiments may include the following configurations (for example, technical proposals).

Configuration 1

An isolator, comprising:
a substrate; and
a plurality of leads,
the substrate including
an upper surface e extending along a plane perpendicular to a first direction,
a lower surface at a side opposite to the upper surface,
a plurality of coils, and
a plurality of conductive parts;
the lower surface having a quadrilateral shape including a first corner, a second corner, a third corner, and a fourth corner when viewed in plan along the first direction,
the plurality of coils being located inside the substrate,
the plurality of coils including a first coil, and a second coil facing the first coil,
the plurality of conductive parts including a first conductive part, a second conductive part, a third conductive part, and a fourth conductive part,
the first conductive part including a first terminal positioned at a first opening, the first opening being located at the first corner,
the second conductive part including a second terminal positioned in a second opening, the second opening being located at the second corner,
the third conductive part including a third terminal positioned at a third opening, the third opening being located at the third corner,
the fourth conductive part including a fourth terminal positioned at a fourth opening, the fourth opening being located at the fourth corner,
the plurality of leads including
a first lead connected with the first terminal by solder,
a second lead connected with the second terminal by solder,
a third lead connected with the third terminal by solder, and
a fourth lead connected with the fourth terminal by solder,
the plurality of leads including a metal.

Configuration 2

The isolator according to Configuration 1, wherein
the first coil is electrically connected with a first semiconductor chip,
the second coil is electrically connected with a second semiconductor chip,
the first conductive part, the second conductive part, the third conductive part, and the fourth conductive part each are electrically insulated from the plurality of coils, and
the first lead, the second lead, the third lead, and the fourth lead each are electrically insulated from the first and second semiconductor chips.

Configuration 3

An isolator, comprising:
a substrate; and
a plurality of leads,
the substrate including
an upper surface extending along a plane perpendicular to a first direction,
a lower surface at a side opposite to the upper surface,
a plurality of coils, and a plurality of conductive parts,
the plurality of coils being located inside the substrate,
the plurality of coils including
a first coil electrically connected with a first semiconductor chip, and
a second coil facing the first coil, the second coil being electrically connected with a second semiconductor chip,
the plurality of conductive parts including a first conductive part, a second conductive part, a third conductive part, and a fourth conductive part,
the first conductive part including a first terminal positioned at a first opening,
the first opening being provided in the lower surface,
the second conductive part including a second terminal positioned at a second opening,
the second opening being provided in the lower surface,
the third conductive part including a third terminal positioned at a third opening,
the third opening being provided in the lower surface,
the fourth conductive part including a fourth terminal positioned at a fourth opening,
the fourth opening being provided in the lower surface,
the first conductive part, the second conductive part, the third conductive part, and the fourth conductive part each being electrically insulated from the plurality of coils,
when viewed in plan along the first direction, the second terminal and the fourth terminal being positioned at a side opposite to the first and third terminals when viewed from a center of the substrate in a second direction,
the second direction being perpendicular to the first direction,
when viewed in plan along the first direction, the third conductive part and the fourth conductive part being positioned at a side opposite to the first and second conductive parts when viewed from a center of the substrate in a third direction,
the third direction being perpendicular to the first and second directions,
the plurality of leads including
a first lead connected with the first terminal by solder,
a second lead connected with the second terminal by solder,
a third lead connected with the third terminal by solder, and
a fourth lead connected with the fourth terminal by solder,
the first lead, the second lead, the third lead, and the fourth lead each being electrically insulated from the first and second semiconductor chips,
the plurality of leads including a metal.

Configuration 4

The isolator according to Configuration 2 or 3, wherein
the plurality of conductive parts includes a fifth conductive part electrically insulated from the plurality of coils,
the fifth conductive part includes a fifth terminal positioned at a fifth opening,
the fifth opening is located at the lower surface,
the plurality of leads includes a fifth lead connected with the fifth terminal by solder, and
the fifth lead is electrically insulated from the first and second semiconductor chips.

Configuration 5

The isolator according to Configuration 4, wherein
a width of the fifth lead is different from a width of the first lead.

Configuration 6

The isolator according to any one of Configurations 2 to 5, wherein
the plurality of conductive parts includes a signal conductive part,
the signal conductive part includes a signal terminal positioned at an opening provided in the lower surface,
the plurality of leads includes a signal lead electrically connected with the signal terminal,
the first coil is electrically connected with the first semiconductor chip via the signal conductive part and the signal lead, and
a width of the first lead is greater than a width of the signal lead.

Configuration 7

The isolator according to any one of Configurations 1 to 6, wherein
a width of the first lead is different from a width of the second lead.

Configuration 8

The isolator according to any one of Configurations 1 to 7, further comprising:
an insulating member,
an upper surface of the first lead including
a connection region contacting solder, and
an adjacent region adjacent to the connection region, the adjacent region not contacting solder,
the insulating member being located on the adjacent region.

Configuration 9

The isolator according to any one of Configurations 1 to 7, wherein
an upper surface of the first lead includes:
a connection region contacting solder;
an adjacent region not contacting solder; and
a step portion between the connection region and the adjacent region.

According to embodiments, an isolator can be provided in which defects can be suppressed.

In this specification, being "electrically connected" includes not only the case of being connected in direct contact, but also the case of being connected via another conductive member, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. An isolator, comprising:
a substrate; and
a plurality of leads,
the substrate including
an upper surface extending along a plane perpendicular to a first direction,
a lower surface at a side opposite to the upper surface,
a plurality of coils, and
a plurality of conductive parts;
the lower surface having a quadrilateral shape including a first corner, a second corner, a third corner, and a fourth corner when viewed in plan along the first direction,
the plurality of coils being located inside the substrate,
the plurality of coils including a first coil, and a second coil facing the first coil,
the plurality of conductive parts including a first conductive part, a second conductive part, a third conductive part, and a fourth conductive part,
the first conductive part including a first terminal positioned at a first opening, the first opening being located at the first corner,
the second conductive part including a second terminal positioned in a second opening, the second opening being located at the second corner,
the third conductive part including a third terminal positioned at a third opening, the third opening being located at the third corner,
the fourth conductive part including a fourth terminal positioned at a fourth opening, the fourth opening being located at the fourth corner,
the plurality of leads including
a first lead connected with the first terminal by solder,
a second lead connected with the second terminal by solder,
a third lead connected with the third terminal by solder, and
a fourth lead connected with the fourth terminal by solder,
the plurality of leads including a metal.

2. The isolator according to claim 1, wherein
the first coil is electrically connected with a first semiconductor chip,
the second coil is electrically connected with a second semiconductor chip,
the first conductive part, the second conductive part, the third conductive part, and the fourth conductive part each are electrically insulated from the plurality of coils, and
the first lead, the second lead, the third lead, and the fourth lead each are electrically insulated from the first and second semiconductor chips.

3. The isolator according to claim 2, wherein
the plurality of conductive parts includes a fifth conductive part electrically insulated from the plurality of coils,
the fifth conductive part includes a fifth terminal positioned at a fifth opening,
the fifth opening is located at the lower surface,
the plurality of leads includes a fifth lead connected with the fifth terminal by solder, and
the fifth lead is electrically insulated from the first and second semiconductor chips.

4. The isolator according to claim 3, wherein
a width of the fifth lead is different from a width of the first lead.

5. The isolator according to claim 2, wherein
the plurality of conductive parts includes a signal conductive part,
the signal conductive part includes a signal terminal positioned at an opening provided in the lower surface,
the plurality of leads includes a signal lead electrically connected with the signal terminal,
the first coil is electrically connected with the first semiconductor chip via the signal conductive part and the signal lead, and
a width of the first lead is greater than a width of the signal lead.

6. The isolator according to claim 1, wherein
a width of the first lead is different from a width of the second lead.

7. The isolator according to claim 1, further comprising:
an insulating member,
an upper surface of the first lead including
a connection region contacting solder, and
an adjacent region adjacent to the connection region, the adjacent region not contacting solder,
the insulating member being located on the adjacent region.

8. The isolator according to claim 1, wherein
an upper surface of the first lead includes:
a connection region contacting solder;
an adjacent region not contacting solder; and
a step portion between the connection region and the adjacent region.

9. An isolator, comprising:
a substrate; and
a plurality of leads,
the substrate including
an upper surface extending along a plane perpendicular to a first direction,
a lower surface at a side opposite to the upper surface,
a plurality of coils, and
a plurality of conductive parts,
the plurality of coils being located inside the substrate,
the plurality of coils including
a first coil electrically connected with a first semiconductor chip, and
a second coil facing the first coil, the second coil being electrically connected with a second semiconductor chip,
the plurality of conductive parts including a first conductive part, a second conductive part, a third conductive part, and a fourth conductive part,
the first conductive part including a first terminal positioned at a first opening,
the first opening being provided in the lower surface,
the second conductive part including a second terminal positioned at a second opening,
the second opening being provided in the lower surface,
the third conductive part including a third terminal positioned at a third opening,
the third opening being provided in the lower surface,
the fourth conductive part including a fourth terminal positioned at a fourth opening,
the fourth opening being provided in the lower surface,
the first conductive part, the second conductive part, the third conductive part, and the fourth conductive part each being electrically insulated from the plurality of coils, when viewed in plan along the first direction, the second terminal and the fourth terminal being positioned at a side opposite to the first and third terminals when viewed from a center of the substrate in a second direction, the second direction being perpendicular to the first direction, when viewed in plan along the first direction, the third conductive part and the fourth conductive part being positioned at a side opposite to the first and second conductive parts when viewed from a center of the substrate in a third direction, the third direction being perpendicular to the first and second directions, the plurality of leads including a first lead connected with the first terminal by solder, a second lead connected with the second terminal by solder, a third lead connected with the third terminal by solder, and a fourth lead connected with the fourth terminal by solder, the first lead, the second lead, the third lead, and the fourth lead each being electrically insulated from the first and second semiconductor chips, the plurality of leads including a metal.

10. The isolator according to claim 9, wherein the plurality of conductive parts includes a fifth conductive part electrically insulated from the plurality of coils, the fifth conductive part includes a fifth terminal positioned at a fifth opening, the fifth opening is located at the lower surface, the plurality of leads includes a fifth lead connected with the fifth terminal by solder, and the fifth lead is electrically insulated from the first and second semiconductor chips.

11. The isolator according to claim 10, wherein a width of the fifth lead is different from a width of the first lead.

12. The isolator according to claim 9, wherein the plurality of conductive parts includes a signal conductive part, the signal conductive part includes a signal terminal positioned at an opening provided in the lower surface, the plurality of leads includes a signal lead electrically connected with the signal terminal, the first coil is electrically connected with the first semiconductor chip via the signal conductive part and the signal lead, and a width of the first lead is greater than a width of the signal lead.

13. The isolator according to claim 9, wherein a width of the first lead is different from a width of the second lead.

14. The isolator according to claim 9, further comprising:

an insulating member, an upper surface of the first lead including a connection region contacting solder, and an adjacent region adjacent to the connection region, the adjacent region not contacting solder, the insulating member being located on the adjacent region.

15. The isolator according to claim 9, wherein an upper surface of the first lead includes:

a connection region contacting solder;

an adjacent region not contacting solder; and a step portion between the connection region and the adjacent region.

* * * * *